US009171626B2

(12) United States Patent
Goda et al.

(10) Patent No.: US 9,171,626 B2
(45) Date of Patent: Oct. 27, 2015

(54) MEMORY DEVICES AND PROGRAMMING MEMORY ARRAYS THEREOF

(75) Inventors: Akira Goda, Boise, ID (US); Haitao Liu, Meridian, ID (US); Krishna Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 628 days.

(21) Appl. No.: 13/561,637

(22) Filed: Jul. 30, 2012

(65) Prior Publication Data

US 2014/0029345 A1    Jan. 30, 2014

(51) Int. Cl.
*G11C 16/04*    (2006.01)
*G11C 16/10*    (2006.01)
*H01L 27/115*   (2006.01)

(52) U.S. Cl.
CPC ............ *G11C 16/10* (2013.01); *G11C 16/0483* (2013.01); *H01L 27/11556* (2013.01); *H01L 27/11582* (2013.01)

(58) Field of Classification Search
CPC .............. G11C 16/10; G11C 16/0483; G11C 11/5628; G11C 16/0425
USPC ........................................ 365/185.18, 185.17
See application file for complete search history.

(56) References Cited

U.S. PATENT DOCUMENTS

| | | | |
|---|---|---|---|
| 7,990,772 B2 | 8/2011 | Damle et al. | |
| 8,098,529 B2 | 1/2012 | Goda | |
| 8,102,712 B2 | 1/2012 | Goda et al. | |
| 2006/0083066 A1* | 4/2006 | Hasegawa et al. | 365/185.18 |
| 2009/0086542 A1* | 4/2009 | Lee et al. | 365/185.17 |
| 2009/0310425 A1 | 12/2009 | Sim et al. | |
| 2010/0195386 A1* | 8/2010 | Huh | 365/185.03 |
| 2011/0198682 A1 | 8/2011 | Naruke | |
| 2011/0260235 A1 | 10/2011 | Orimoto et al. | |
| 2011/0303958 A1 | 12/2011 | Matsuo et al. | |
| 2012/0051137 A1 | 3/2012 | Hung et al. | |
| 2013/0182509 A1* | 7/2013 | Lee et al. | 365/185.22 |

OTHER PUBLICATIONS

Goda, et al., "Memory Devices and Biasing Methods for Memory Devices," U.S. Appl. No. 13/438,331, filed Apr. 3, 2012.

\* cited by examiner

*Primary Examiner* — Tuan T Nguyen
(74) *Attorney, Agent, or Firm* — Dicke, Billig & Czaja, PLLC

(57) ABSTRACT

An embodiment of a method includes decreasing a difference of a voltage applied to a first select gate minus a voltage applied to a source while the first select gate is off, decreasing a difference of a voltage applied to a second select gate minus a voltage applied to a data line while the second select gate is off, and increasing a voltage of a signal applied to a selected access line that is coupled to an untargeted memory cell in a string of memory cells coupled to the first and second select gates to a program voltage after or substantially concurrently with decreasing the difference of the voltage applied to the first select gate minus the voltage applied to the source and with decreasing the difference of the voltage applied to the second select gate minus the voltage applied to the data line.

27 Claims, 11 Drawing Sheets

MEMORY DEVICES AND PROGRAMMING MEMORY ARRAYS THEREOF

FIELD

The present disclosure relates generally to memory devices and in particular the present disclosure relates to memory devices and programming memory arrays thereof.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line.

A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

To meet the demand for higher capacity memories, designers continue to strive for increasing memory density, i.e., the number of memory cells for a given area of an integrated circuit die. One way to increase memory density is to reduce the feature size of individual memory cells. Another way of increasing the density of memory devices is to form stacked memory arrays, e.g., often referred to as three-dimensional memory arrays. For example, one type of three-dimensional memory array may include pillars of stacked memory elements, such as substantially vertical NAND strings. A number of undesirable effects can occur however when operating memory devices comprising these vertical structures, such as charge leakage and other phenomena which can introduce uncertainty and reduce reliability during various memory device operations, such as programming and/or sensing operations, for example.

For the reasons stated above, and for other reasons stated below which will become apparent to those skilled in the art upon reading and understanding the present specification, there is a need in the art for alternative methods of operating memory device with pillars of stacked memory elements.

DETAILED DESCRIPTION

Figure 1:
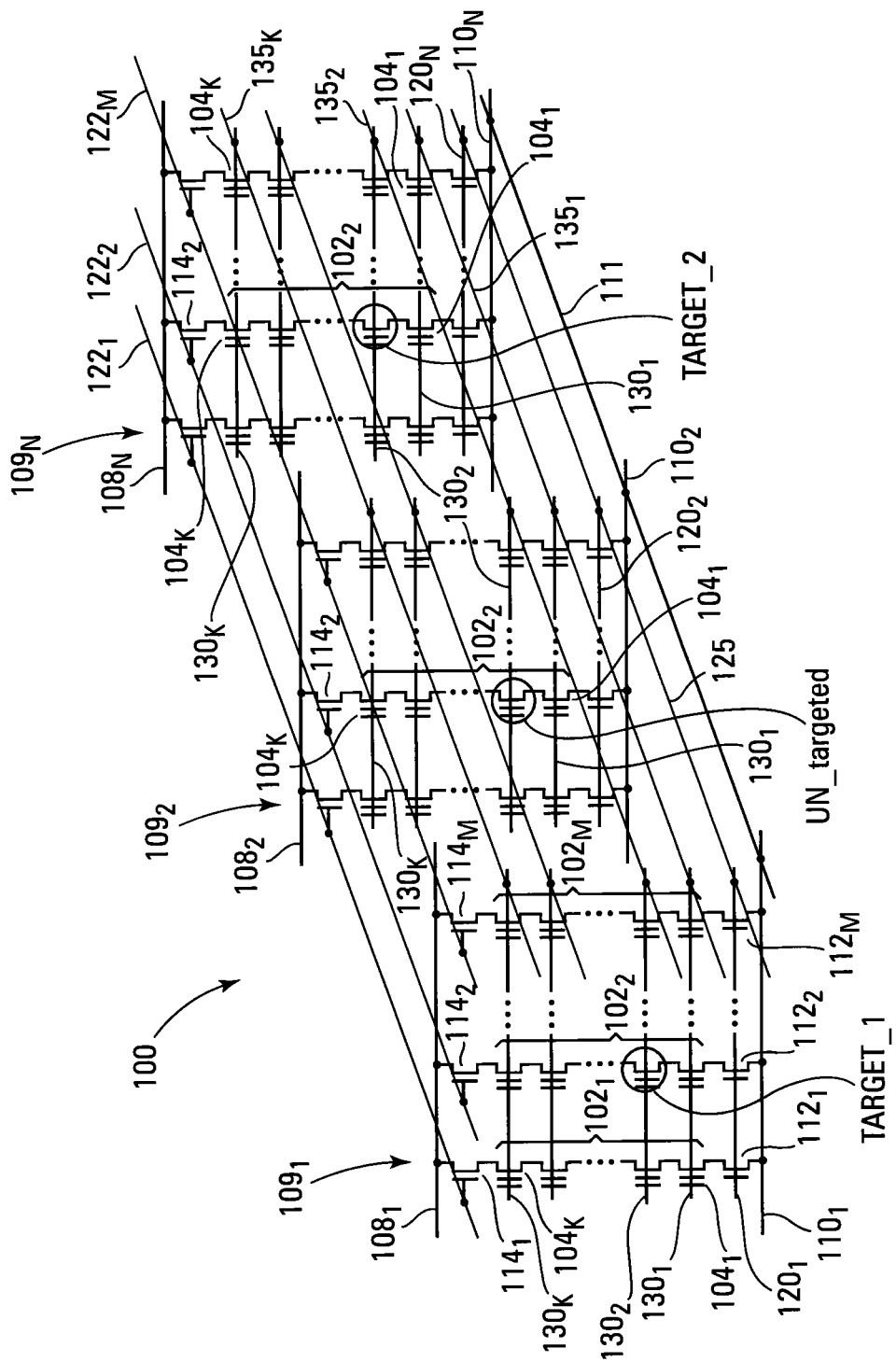
FIG. 1 illustrates a schematic representation of a memory array of the background art.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic representation of a memory array 100 that includes substantially vertical (e.g., vertical) strings 102 (e.g., NAND strings) of series-coupled memory cells $104_1$ to $104_K$, e.g., non-volatile memory cells, that may be located adjacent to (e.g., on) substantially vertical (e.g., vertical) semiconductor pillars, e.g., that may be polysilicon. A semiconductor pillar may act as channel region for the string of memory cells adjacent thereto. That is, during operation of one or more memory cells 104 of a string 102, a channel can be formed in the corresponding semiconductor pillar.

The strings 102 may be each coupled between a data line, such as a bit line 108 (e.g., between one of bit lines $108_1$ to $108_N$) and a source 110. A plurality of strings 102 may be coupled to the same bit line, such as strings $102_1$ to $102_M$. For example, a plurality of strings 102 coupled to the same bit line may be referred to as a two-dimensional array 109 of memory cells 104. For example, two-dimensional arrays $109_1$ to $109_N$ may be respectively coupled to bit lines $108_1$ to $108_N$ and respectively coupled to sources $110_1$ to $110_N$. Sources 110 may be commonly coupled to a common source 111.

One end of each string 102 of each two-dimensional array 109 may be selectively coupled to a source 110 through a select gate, such as a source select gate 112. For example, strings $102_1$ to $102_M$ may be respectively coupled in series with source select gates $112_1$ to $112_M$, and source select gates $112_1$ to $112_M$ may be coupled to a source 110 in order to respectively selectively couple strings $102_1$ to $102_M$ to that source 110. An opposite end of each string 102 of each two-dimensional array 109 may be selectively coupled to a bit line 108 through a select gate, such as a drain select gate 114. For example, strings $102_1$ to $102_M$ may be respectively coupled in series with drain select gates $114_1$ to $114_M$, and drain select gates $114_1$ to $114_M$ may be coupled to a bit line 108 in order to respectively selectively couple strings $102_1$ to $102_M$ to that bit line 108.

The select gates $112_1$ to $112_M$ of each two-dimensional array 109 may be commonly coupled to a select line, such as a source select line 120. For example, two-dimensional arrays $109_1$ to $109_N$ may respectively include source select lines $120_1$ to $120_N$, each of which may be commonly coupled to the source select gates $112_1$ to $112_M$ of a respective one of the two-dimensional arrays $109_1$ to $109_N$. Source select lines $120_1$ to $120_N$ may be commonly coupled to a common source select line 125.

Select lines, such as drain select lines $122_1$ to $122_M$, may be respectively commonly coupled to the drain select gates $114_1$ to $114_M$ of each two-dimensional array 109. For example, drain select line $122_1$ may be commonly coupled to the drain select $114_1$ coupled to the string $102_1$ of each of the two-dimensional arrays $109_1$ to $109_N$; drain select line $122_2$ may be commonly coupled to the drain select $114_2$ coupled to the string $102_2$ of each of the two-dimensional arrays $109_1$ to $109_N$; . . . ; and drain select line $122_M$ may be commonly coupled to the drain select $114_M$ coupled to the string $102_M$ of each of the two-dimensional arrays $109_1$ to $109_N$.

The memory cells $104_1$ to $104_K$ of each of strings $102_1$ to $102_M$ of each of two-dimensional arrays $109_1$ to $109_N$ may be respectively commonly coupled to access lines, such as word lines $130_1$ to $130_K$. For example, memory cells $104_1$ of each of strings $102_1$ to $102_M$ of each of two-dimensional arrays $109_1$ to $109_N$ may be commonly coupled to word line $130_1$; memory cells $104_2$ of each of strings $102_1$ to $102_M$ of each of two-dimensional arrays $109_1$ to $109_N$ may be commonly coupled to word line $130_2$; . . . ; and memory cells $104_K$ of each of strings $102_1$ to $102_M$ of each of two-dimensional arrays $109_1$ to $109_N$ may be commonly coupled to word line $130_K$. Word lines $130_1$ to $130_K$ may be respectively commonly coupled to common word lines $135_1$ to $135_K$.

A memory cell, e.g., the circled memory cell Target_1, in the string $102_2$ of two-dimensional array $109_1$ that is selectively coupled to bit line $108_1$ and coupled to common word line $135_2$ and a memory cell, e.g., the circled memory cell Target_2, in the string $102_2$ of two-dimensional array $109_N$ that is selectively coupled to bit line $108_N$ and coupled to common word line $135_2$ may be targeted for programming. A memory cell, e.g., the circled memory cell UN_targeted, in the string $102_2$ of two-dimensional array $109_2$ that is selectively coupled to bit line $108_2$ and coupled to common word line $135_2$ may be untargeted and is not be programmed. Note that word lines $130_2$ that are respectively coupled to memory cells Target_1, Target_2, and UN_targeted are commonly coupled to common word line $135_2$. As such, word lines $130_2$ and common word line $135_2$ may be selected word lines.

Note that strings $102_2$ containing memory cells Target_1, UN_targeted, and Target_2 may be respectively coupled to bit lines $108_1$, $108_2$, and $108_N$ by drain select gates $114_2$ that are commonly coupled to drain select line $122_2$. Note that the strings $102_2$ containing memory cells Target_1, UN_targeted, and Target_2 may be respectively coupled to sources $110_1$, $110_2$, and $110_N$ by source select gates $112_2$ that are commonly coupled to common source select line 125. Note that sources $110_1$, $110_2$, and $110_N$ may be commonly coupled to common source 111.

The untargeted memory cells, including the memory cell UN_targeted, that are coupled to common word line $135_2$ may be prevented (e.g., inhibited) from being programmed. Note that memory cells in strings $102_1$ and $102_M$ that are coupled to common word line $135_2$ may be prevented (e.g., inhibited) from being programmed. Note that strings $102_1$ are selectively respectively coupled to bit lines $108_1$ to $108_N$ by drain select gates $114_1$ that are commonly coupled to drain select line $122_1$, and strings $102_M$ are selectively respectively coupled to bit lines $108_1$ to $108_N$ by drain select gates $114_M$ that are commonly coupled to drain select line $122_M$.

Figure 2A:
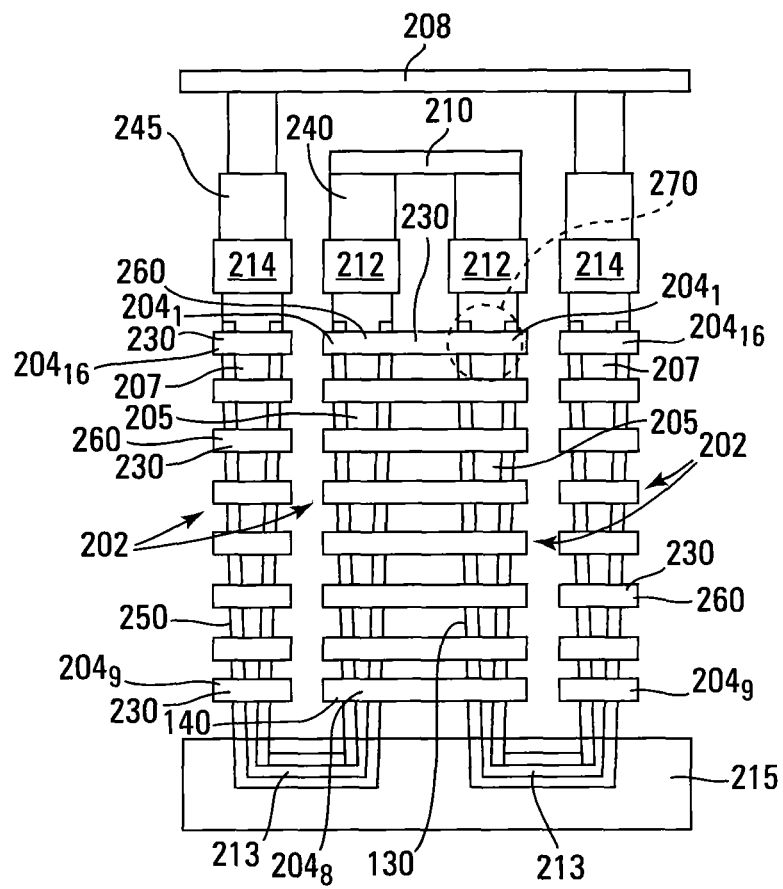
FIG. 2A illustrates an example of a portion of a memory array of the background art where portions of a string of series-coupled memory cells are formed on two substantially vertical semiconductor pillars.

FIG. 2A illustrates a portion of a three-dimensional memory array, such as a portion of one of the two-dimensional arrays 109 of memory array 100 in FIG. 1. For example, each of the strings 102 in FIG. 1 may be configured as strings 202 in FIG. 2A, where a portion of the memory cells 204 of each string 202 (e.g., series-coupled memory cells $204_1$ to $204_8$) may be formed adjacent to (e.g., on) a semiconductor pillar 205, e.g., of polysilicon, and another portion of the memory cells 204 of each string 202 (e.g., series-coupled memory cells $204_9$ to $204_{16}$) may be formed adjacent to (e.g., on) a semiconductor pillar 207, e.g., of polysilicon.

Pillars 205 and 207 may be coupled together by a semiconductor 213 formed in a conductor 215. Semiconductor 213 can electrically couple pillars 205 and 207 in response to applying an appropriate bias to conductor 215. Pillars 205 and 207 may be conductively doped, e.g., to at least have a p-type or an n-type conductivity region, or may undoped. The pillars 205 and 207 may act as channel region for the string of memory cells adjacent to pillars 205 and 207. For example, during operation of one or more memory cells 204 of a string 202, a channel can be formed in the corresponding semiconductor pillars 205 and 207.

A select gate, such as a source select gate 212, may be formed adjacent to each of pillars 205 and may be coupled in series with a memory cell $204_1$, e.g., through a respective pillar 205. A select gate, such as a drain select gate 214, may be formed adjacent to each of pillars 207 and may be coupled in series with a memory cell $204_{16}$, e.g., through a respective pillar 207. Therefore, each string 202 is coupled in series between a source select gate 212 and a drain select gate 214.

Drain select gates 214 may be commonly coupled to a bit line 208, and source select gates 212 may be commonly coupled to a source 210.

Source 210 may be coupled to source select gates 212 through conductively doped regions 240, such as source/drain regions, and bit line 208 may be coupled to drain select gates 214 through conductively doped regions 245, such as source/drain regions, e.g., where conductively doped regions 240 and 245 have a different doping than pillars 205 and 207. For example, conductively doped regions 240 and 245 might be conductively doped to an n-type conductivity (e.g., n+ type conductivity), whereas pillars 205 and 207 might have p-type doping, no doping, or a lower n-type doping than conductively doped regions 240 and 245 (e.g., $n^-$-doping when conductively doped regions 240 and 245 have $n^+$ doping). This may result in diffusion junctions adjacent to (e.g., under) source select gates 212 and drain select gates 214.

In one example, the n-type regions 240 may be formed in portions of pillars 205 adjacent to ends of pillars 205 and adjacent to source select gates 212; the n-type regions 245 may be formed in portions of pillars 207 adjacent to ends of pillars 207 and adjacent to drain select gates 214; and the region having the different doping than n-type regions 240 and 245, such as p-type doping, no doping, or a lower level of n-type doping than n-type regions 240 and 245, may be formed in portions of pillars 205 and 207 adjacent to (e.g., under) strings 202.

Figure 2B:
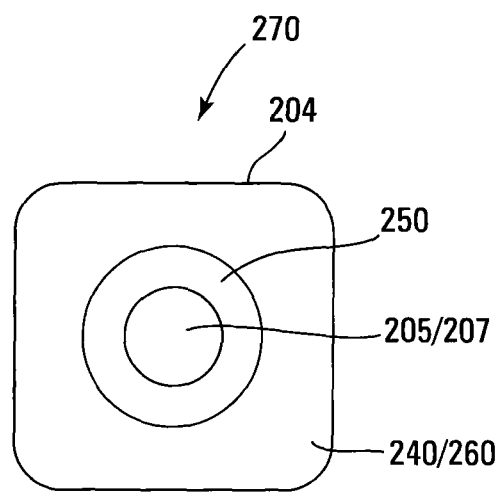
FIG. 2B is a cross-sectional view of circled region 270 in FIG. 2A.

A memory cell 204 may encircle a pillar 205/207, as shown in FIG. 2B, a cross-section of circled region 270 in FIG. 2A. Source select gates 212 may encircle pillars 205, and drain select gates 214 may encircle pillars 207.

In other examples, the n-type regions 240 and 245 may be respectively formed in pillars that may be respectively in contact with pillars 205 and 207 and that may be formed independently of pillars 205 and 207. In such examples, all of pillars 205 and 207 may have the p-type conductivity.

Charge-storage structures 250 may be adjacent to (e.g., on) pillars 205 and 207. Memory cells 204 may each include a control gate 260 (e.g., as a portion of or coupled to an access line, such as a word line 230) located adjacent to a respective charge-storage structure 250.

Figure 3:
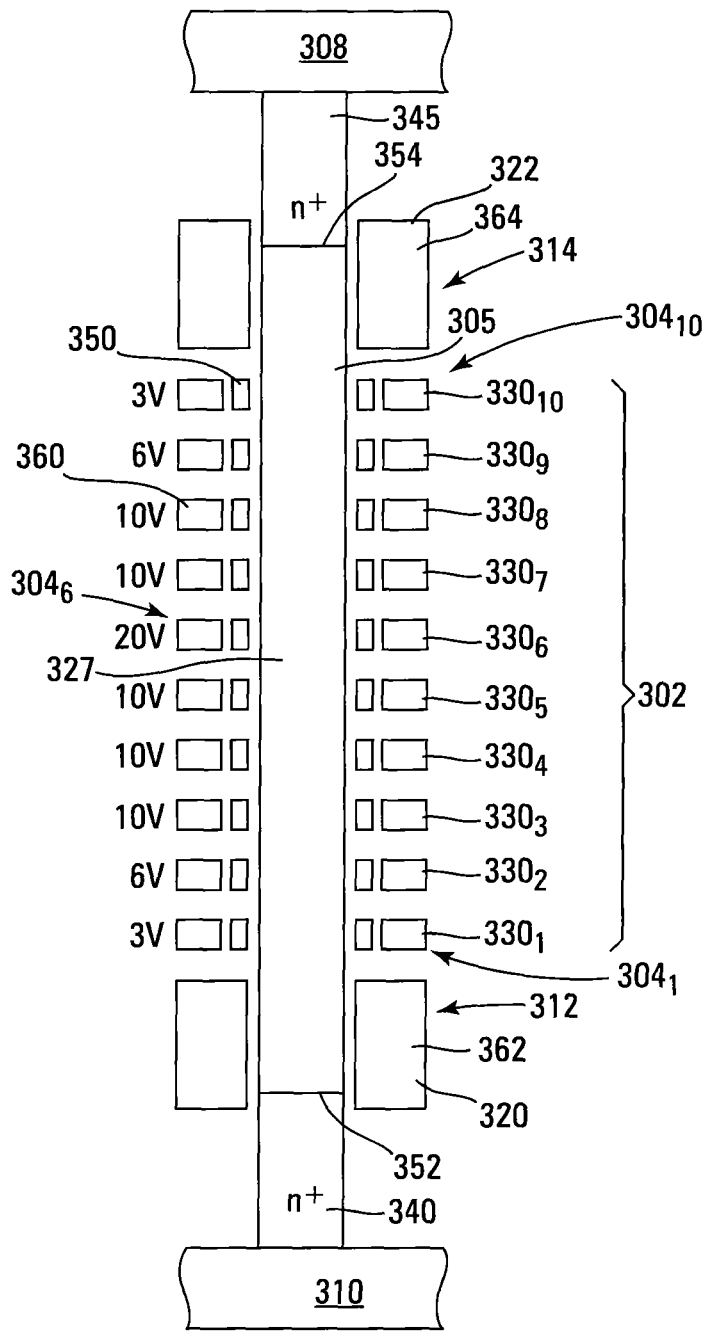
FIG. 3 illustrates an example of a portion of a memory array of the background art where a string of series-coupled memory cells is formed on a substantially vertical semiconductor pillar.

Each of the strings 102 in FIG. 1 may be configured as shown in FIG. 3 for a substantially vertical (e.g., a vertical) string 302 of memory cells 304. FIG. 3 is a cross-sectional view showing string 302 formed adjacent to (e.g., on) a substantially vertical (e.g., a vertical) semiconductor pillar 305, e.g., of polysilicon. Memory cells 304 may encircle pillar 305 in a manner similar to that shown in FIG. 2B.

A portion 327 of pillar 305, e.g., adjacent to string 302, may be conductively doped to have a p-type conductivity region, such as p-conductivity region, or an n-type conductivity region. For other embodiments, pillar 305 or at least portion 327 of pillar 305 might be undoped. Pillar 305 or at least portion 327 of pillar 305 may act as channel region for the string 302. That is, during operation of one or more memory cells 304 of string 302, a channel can be formed in pillar 305 or at least portion 327 of pillar 305. For some embodiments, portion 327 of pillar 305 might be all of pillar 305.

A select gate, such as a source select gate 312, may be adjacent to (e.g., on) pillar 305 and may be coupled to one end of string 302 through pillar 305, and a select gate, such as a drain select gate 314, may be adjacent to (e.g., on) pillar 305 and may be coupled to an opposite end of string 302 through pillar 305. Source select gate 312 and drain select gate 314 may encircle pillar 305.

Source select gate 312 may be coupled to a source 310 through a source/drain region 340, such as an n-type source/drain region 340, e.g., an n+ conductivity type source/drain region. For example, portion 327 of pillar 305 may be doped differently than source/drain region 340, e.g., portion 327 of pillar 305 might have p-type doping, no doping, or a lower level n-type doping than source/drain region 340 (e.g., $n^-$-doping when source/drain region 340 has $n^+$ doping). As such, a diffusion junction, such as a body-diffusion junction 352, may be adjacent to (e.g., under) source select gate 312.

Drain select gate 314 may be coupled to a bit line 308 through a source/drain region 345, such as an n-type source/drain region, e.g., an n+ conductivity type source/drain region. For example, portion 327 of pillar 305 may be doped differently than source/drain region 345, e.g., portion 327 of pillar 305 might have p-type doping, no doping, or a lower n-type doping than source/drain region 345 (e.g., $n^-$-doping when source/drain region 345 has $n^+$ doping). As such, a diffusion junction, such as a body-diffusion junction 354, may be adjacent to (e.g., under) drain select gate 314. Note that source select gate 312 and drain select gate 314 respectively selectively couple string 302 to source 310 and bit line 308.

In one example, source/drain region 340 may be formed in a portion of pillar 305 adjacent to an end of pillar 305 and adjacent to source select gate 312; a source/drain region 345 may be formed in a portion of pillar 305 adjacent to an end of pillar 305 and adjacent to drain select gate 314; and the portion 327 of pillar 305 may be adjacent to (under) string 302. For example, source/drain regions 340 and 345 might be adjacent to portion 327 of pillar 305 so that portion 327 of pillar 305 is between source/drain regions 340 and 345.

Alternatively, for other examples, the source/drain regions 340 and 345 may be respectively formed in pillars that may be respectively in contact with opposite ends of pillar 305 and that may be formed independently of pillar 305. Such examples are examples of portion 327 of pillar 305 being all of pillar 305.

Each memory cell 304 may include a charge-storage structure 350 adjacent to pillar 305, e.g., adjacent to portion 327 of pillar 305, and a control gate 360 (e.g., that may be coupled to or may form a portion of a word line 330) adjacent to the charge-storage structure 350. Source select gate 312 may include a control gate 362, e.g., that may be coupled to or may form a portion of a source select line 320. Drain select gate 314 may include a control gate 364, e.g., that may be coupled to or may form a portion of a drain select line 322.

In one example, a program voltage, e.g., 20V, might be applied to selected word line $330_6$, coupled to memory cell $304_6$ in string 304 in FIG. 3, to program a target memory cell (not shown in FIG. 3) other than the memory cell $304_6$, where the target memory cell is also coupled to word line $330_6$. For example, the target memory cell might be in a string other than string 302 in FIG. 3 that is on a pillar other than pillar 305.

The string with the target memory cell might be coupled to bit line 308 or might be coupled to a bit line other than bit line 308. For example, memory cell $304_6$ and the target memory cell could correspond to memory cells coupled to a common word line 135 in FIG. 1 that are either in different strings 102 in the same two-dimensional array 109 or in different strings 102 in different two-dimensional arrays 109. For example, memory cell $304_6$ might correspond to the memory cell UN_targeted in FIG. 1 or a memory cell in string $102_1$ in FIG. 1 that is commonly coupled to word line $130_2$, and thus common word line $135_2$, with the targeted memory cell Target_1.

Source select line 320 may be commonly coupled to the source select gate 312 coupled to string 304 and to the string with the target memory cell. Note that the source select gates 112 in FIG. 1 may be commonly coupled, e.g., to common source select line 125.

Therefore, memory cell $304_6$ may be inhibited from being programmed. As such, string 302 and pillar 305 may be said to be an inhibited string and an inhibited pillar, respectively. In the example, a voltage of 3V might be applied to unselected word lines $330_1$ and $330_{10}$ (e.g., that may be referred to as "edge" or "dummy" word lines) that are respectively coupled to memory cells $304_1$ and $304_{10}$ that are respectively adjacent to source select gate 312 and drain select gate 314. A voltage of 6V might be applied to unselected word lines $330_2$ and $330_9$, and a voltage of 10V might be applied to the remaining unselected word lines, e.g., word lines $330_3, 330_4, 330_5, 330_7,$ and $330_8$. Note that word lines $330_1$ to $330_{10}$ may be commonly coupled to the respective memory cells $304_1$ to $304_{10}$ of string 302 and respective memory cells of a string having the target memory cell. The voltages applied to the unselected word lines are such that the memory cells other than the target memory cell in the string with the target memory cell are not programmed.

While the word line voltages are applied, a voltage of about zero volts might be applied to source select line 320, source 310, and drain select line 322 so that source select gate 312 and drain select gate 314 are off and source 310 and bit line 308 are decoupled from string 302. Therefore, string 302 and the portion 327 of pillar 305 may be floating. The word line voltages may be capacitively coupled to the portion 327 of pillar 305, and may act boost the portion 327, e.g., to a voltage of about 12V. This can result in a voltage differential across memory cell $304_6$ that can act to prevent (e.g., inhibit) memory cell $304_6$ from being programmed.

Since the portion 327 of pillar 305 is floating, electron-hole pairs may be generated, e.g., due to thermal generation and/or junction leakage, etc. As a result, holes may accumulate in the portion 327 of pillar 305 under source select gate 312 adjacent to body-diffusion junction 352 and in the portion 327 of pillar 305 under drain select gate 314 adjacent to body-diffusion junction 354.

Figure 4:
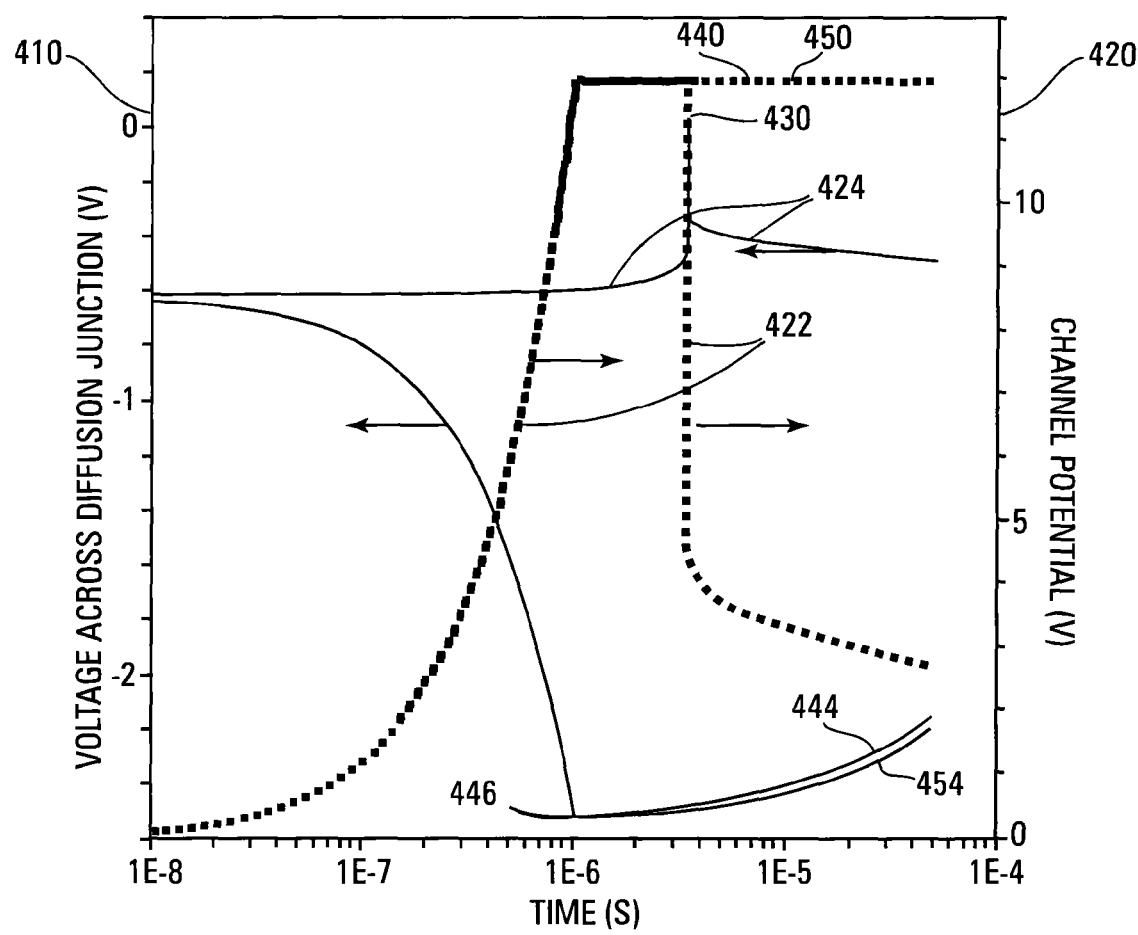
FIG. 4 illustrates curves of channel potentials and curves of voltages across diffusion junctions adjacent to select gates for programming methods of the background art and for examples of programming methods of the present disclosure.

FIG. 4 illustrates curves (e.g., dashed curves) of the voltage of the portion 327 (e.g., the channel potential) and curves (e.g., solid curves) of the voltage across a p-n junction, such as body-diffusion junction 352, for an example of a programming (e.g., inhibiting) method of the background art and for examples of the programming (e.g., inhibiting) methods of the present disclosure.

The ordinate axis (e.g., the y-axis) 410 corresponds to the solid curves and represents the voltage across body-diffusion junction 352. The ordinate axis (e.g., the y-axis) 420 corresponds to the dashed curves and represents the channel potential. The abscissa axis (e.g., the x-axis) represents time, e.g., starting at 1E-8 seconds.

Curves 422 and 424 respectively show what could happen to the channel potential and the voltage across body-diffusion junction 352 when the voltages shown in FIG. 3 are applied to the word lines, and, for example, when the voltage applied to source 310 (e.g., about 1V) and the voltage applied to source select line 320 (e.g., about 0V) are held constant. For example, curve 422 shows that the channel voltage may increase (e.g., may be boosted) from about 0V to about 12V and then may become uniform (e.g. constant) at about 12V.

Curve 424 shows that the voltage across body-diffusion junction 352, remains nearly uniform (e.g., constant), e.g., at about −0.6V, and thus is at an equilibrium status. This is because the voltage of the portion 327 of pillar 305 under source select gate 312 due to the capacitive coupling between source select line 320 and the portion 327 of pillar 305 under source select gate 312 remains at about −0.6V, in that the voltage applied to source select line 320 remains at 0V. When the channel voltage reaches a certain voltage, e.g., about 8.5V for the present example, the voltage across body-diffusion junction 352 may start to increase at an increasing rate until the voltage across body-diffusion junction 352 becomes positive at a point 430. This may be due to the holes accumulating in the portion 327 of pillar 305 under source select gate 312.

When the voltage across body-diffusion junction 352 becomes positive, body-diffusion junction 352 becomes forward biased, and may allow current to flow from the portion 327 of pillar 305 to source 310 across body-diffusion junction 352. The current flow can cause a reduction in the channel voltage (e.g., as shown by curve 422), resulting in the voltage across memory cell $304_6$ to be insufficient to inhibit memory cell $304_6$ from being programmed. Similar behavior could occur at body-diffusion junction 354 under drain select gate 314 and in the portion 327 of pillar 305, e.g., when the voltage applied to bit line 308 (e.g., about 1V) and the voltage applied to drain select line 322 (e.g., about 0V) are held constant.

For some embodiments of the present disclosure, a difference of the voltage applied to source select gate 312 minus the voltage applied to source 310 may be decreased while source select gate 312 is off. This may cause the voltage across body-diffusion junction 352 to decrease (e.g., increase negatively), and thus body-diffusion junction 352 to become increasingly negatively biased, e.g., in a manner similar to that shown by curves 444 and 454 in FIG. 4. Curves 444 and 454 show that the body-diffusion junction 352 becomes increasingly more reversed biased, e.g., as the channel voltage is boosted, as indicated by curves 440 and 450.

The voltage across body-diffusion junction 352 at point 446 may be sufficiently negative so as to keep the voltages across body-diffusion junction 352 negative and body-diffusion junction 352 reverse biased. As such, current flow across body-diffusion junction 352 from the portion 327 of pillar 305 to source 310 can be substantially prevented, and channel voltage can be maintained. Similar behavior may occur for body-diffusion junction 354 when a difference of the voltage applied to drain select gate 314 minus the voltage applied to bit line 308 is decreased while select gate 314 is off. Curve 444 and curve 440 are discussed further below in conjunction with FIGS. 6 and 7, and curve 454 and curve 450 are discussed further below in conjunction with FIGS. 8 and 9.

Figure 5:
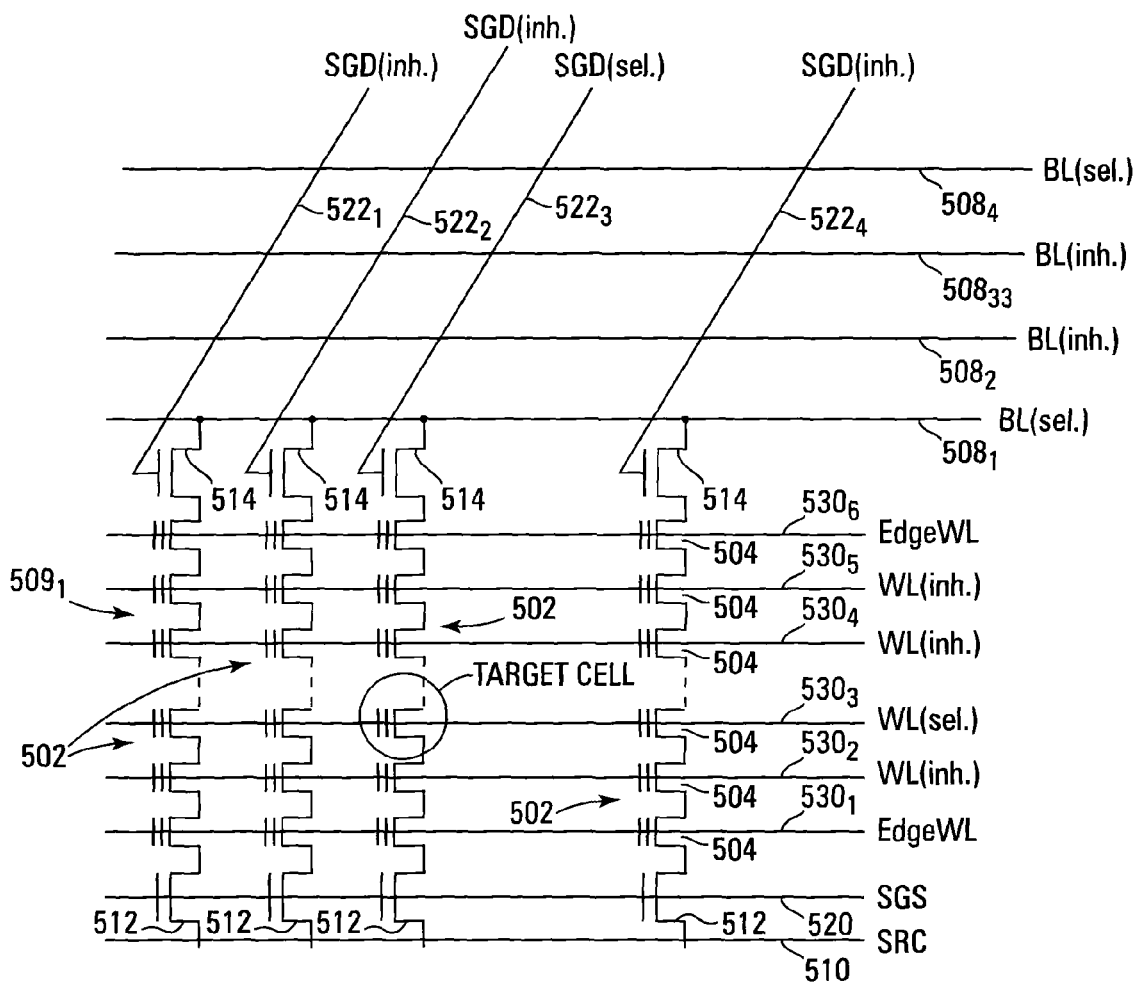
FIG. 5 is schematic representation of a portion of a memory array, showing the various signals received (e.g., applied) during programming of a target memory cell, according to another embodiment.

FIG. 5 is schematic representation of a portion of a memory array, such as memory array 100 in FIG. 1, showing the various signals received (e.g., applied) during programming of the circled target memory cell, e.g., that may be analogous to the memory cell Target_1 in FIG. 1. The memory array in FIG. 5 includes substantially vertical (e.g., vertical) strings 502 of memory cells 504. Each string 502 may be coupled between select gates, such as a source select gate 512 and a drain select gate 514. Each source select gate 512 may selectively couple a respective string 502 to a source 510 that may receive a signal SRC during programming of the target memory cell. Each drain select gate 514 may selectively couple a respective string 502 to a bit line $508_1$ that may receive a signal BL(sel.) during programming of the target memory cell.

Source select gates 512 may be commonly coupled to a select line, such as a source select line 520, that may receive a signal SGS during programming of the target memory cell. A drain select gate 514 may be coupled to the string 502 with the target memory cell and may be coupled to a select line, such as a drain select line $522_3$, that may receive a signal SGD(sel.) during programming of the target memory cell. The remaining drain select gates 514 may be respectively coupled to select lines, such as drain select lines 522₁, 522₂, and 522₄, that may receive a signal SGD(inh.) during programming of the target memory cell. That is, drain select lines 522₁, 522₂, and 522₄ may be coupled to drain select gates 514 that may be coupled to strings 502 whose memory cells are not selected for programming.

An edge word line 530₁ may be commonly coupled to memory cells adjacent to the source select gates 512, and an edge word line 530₆ may be commonly coupled to memory cells adjacent to the drain select gates 514. Edge word lines 530₁ and 530₆ may receive a signal EdgeWL during programming of the target memory cell.

Word line 530₃ may be commonly coupled to the target memory cell and to memory cells from other strings 502 not selected for programming. Word line 530₃ may be a selected word line and may receive a signal WL(sel.) during programming of the target memory cell. The memory cells not selected for programming and coupled to word line 530₃ may be analogous to memory cell 304₆ in FIG. 3. Each of word lines 530₂, 530₄, and 530₅ may be commonly coupled to memory cells that are not selected for programming and may receive a signal WL(inh.) during programming of the target memory cell.

Each of bit lines 508₂, 508₃, and 508₄ may be selectively coupled to strings of memory cells by drain select gates in manner similar to bit line 508₁. Bit lines 508₂, 508₃, and 508₄ may respectively receive signals BL(inh.), BL(inh.), and BL(sel.) during programming of the target memory cell.

The strings of memory cells selectively coupled to each of bit lines 508₂, 508₃, and 508₄ may be selectively coupled to a source by source select gates. Bit line 508₁ may be analogous to bit line 108₁ in FIG. 1, each of bit lines 508₂ and 508₃ may be analogous to bit line 108₂ in FIG. 1, and bit line 508₄ may be analogous to bit line 108ₙ in FIG. 1. That is, each of bit lines 508₂, 508₃, and 508₄ may be coupled to a two-dimensional array in a manner similar to bit line 508₁ being coupled to two-dimensional array 509₁ in FIG. 1. For example, each of bit lines 508₂ and 508₃ may be coupled to a two-dimensional array in a manner similar to bit line 108₂ being coupled to two-dimensional array 109₂ in FIG. 1, and bit line 508₄ may be coupled to a two-dimensional array in a manner similar to bit line 108ₙ being coupled to two-dimensional array 109ₙ in FIG. 5.

Word lines 530₁ to 530₆ in two-dimensional array 509₁ coupled to bit line 508₁ in FIG. 5 may be respectively commonly coupled to word lines in the two-dimensional arrays coupled to bit lines 508₂, 508₃, and 508₄, e.g., in a manner similar to word lines 130₁ to 130ₖ being respectively commonly coupled to common word lines 135₁ to 135ₖ in FIG. 1. Source select line 520 in two-dimensional array 509₁ may be commonly coupled with source select lines in the two-dimensional arrays coupled to bit lines 508₂, 508₃, and 508₄, e.g., in a manner similar to source select lines 120₁ to 120ₙ being commonly coupled to common source select line 125 in FIG. 1. Source 510 in two-dimensional array 509₁ may be commonly coupled with sources in the two-dimensional arrays coupled to bit lines 508₂, 508₃, and 508₄, e.g., in a manner similar to sources 110 being commonly coupled to common source 111 in FIG. 1. Drain select lines 522₁ to 522₄, may be respectively commonly coupled to drain select gates in the two-dimensional arrays coupled to bit lines 508₁, 508₂, 508₃, and 508₄, e.g., in a manner similar to drain select lines 122₁ to 122ₘ being respectively commonly coupled to the drain select gates 114₁ to 114ₘ in each two-dimensional array 109 in FIG. 1.

The string selectively coupled to bit line 508₄ by a drain select gate coupled to drain select line 522₃ may include a memory cell, such as the memory cell Target_2 in FIG. 1, that is coupled to selected word line 530₃. For some embodiments, strings selectively coupled to bit lines 508₂ and 508₃ by drain select gates coupled to drain select line 522₃ may include a memory cell, such as the memory cell UN-targeted in FIG. 1, that is not selected for programming and that is coupled to selected word line 530₃.

Figure 6:
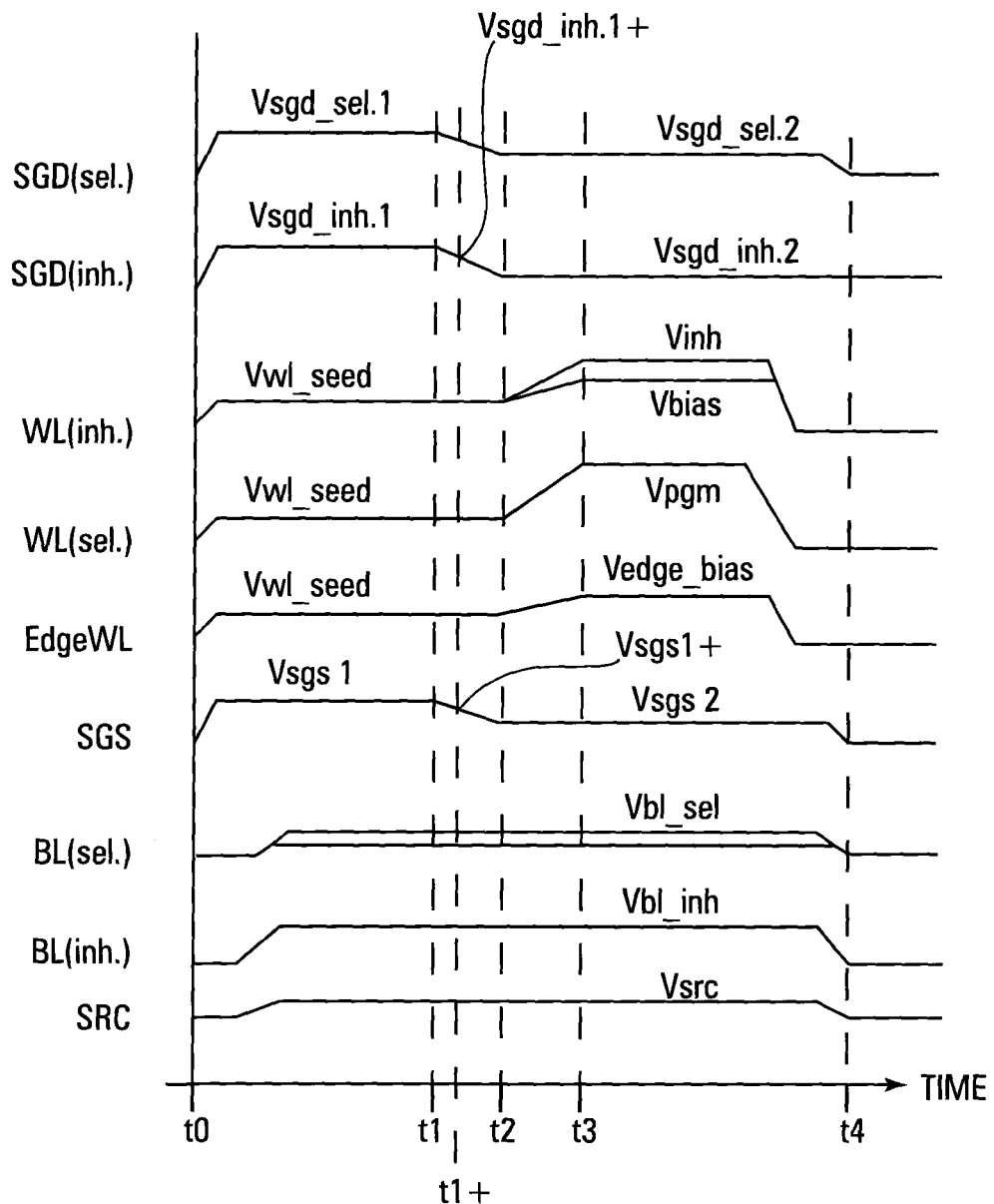
FIG. 6 illustrates waveforms for the signals that may be received by (e.g., may be applied to) a memory array during programming of that memory array, according to another embodiment.

FIG. 6 illustrates waveforms for the signals SGD(sel.), SGD (inh.), WL(inh.), WL(sel.), EdgeWL, SGS, BL(sel.), BL(inh.), and SRC that may be received by (e.g., may be applied to) to memory array 100 in FIG. 1, the structure in FIG. 3, or the memory array in FIG. 5 during a programming cycle for programming one or more target memory cells, such as the memory cells Target_1 and Target_2 in FIG. 1 or the circled target memory cell in FIG. 5.

The signal WL(inh.) may be applied to unselected word lines, such as word lines 530₂, 530₄, and 530₅ in FIG. 5, word lines 330₂ to 330₅ and word lines 330₇ and 330₉ in FIG. 3, or word lines commonly coupled to common word lines 135 other than common word line 135₂ in FIG. 1. For example, the voltage (e.g., potential) of signal WL(inh.) may be increased, e.g., from about 0V at a time t0, to a precharge (e.g., seed) voltage Vwl_seed, e.g., of about 2V, as shown in FIG. 6. Voltage Vwl_seed may be maintained until a time t2. The voltage of signal WL(inh.) may then be increased (e.g., ramped up), e.g., starting at time t2, from voltage Vwl_seed until the voltage of signal WL(inh.) reaches an inhibit voltage Vinh, e.g., of about 10V, or a bias voltage Vbias, e.g., of about 6V, at time t3. For example, inhibit voltage Vinh might be applied to word lines 330₃ to 330₅ and word lines 330₇ and 330₈ in FIG. 3, and bias voltage Vbias might be applied to word lines 330₂ and 330₉ in FIG. 3. Subsequently, the voltage of signal WL(inh.) may be reduced (e.g., ramped down), e.g., to about 0V, from voltage Vinh or voltage Vbias. For example, the word lines receiving signal WL(inh.) may be discharged from voltage Vinh or voltage Vbias.

The signal WL(sel.) may be applied to a selected word line that is coupled to the target memory cell, such as word line 530₃ in FIG. 5, word line 330₆ in FIG. 3, or common word line 135₂ in FIG. 1. For example, the voltage (e.g., potential) of signal WL(sel.) may be increased (e.g., ramped up), e.g., from about 0V at a time t0, to the voltage Vwl_seed that may be maintained until time t2, as shown in FIG. 6. The voltage of signal WL(sel.) may then be increased, e.g. starting at time t2, from the voltage Vwl_seed until the voltage of signal WL(sel.) reaches a program voltage Vpgm, e.g., of about 20V, at time t3. Subsequently, the voltage of signal WL(sel.) may be reduced (e.g. ramped down), e.g., to about 0V, from the voltage Vpgm. For example, the word line receiving signal WL(sel.) may be discharged from the voltage Vpgm.

The signal EdgeWL may be applied to edge word lines, such as word lines 530₁ and 530₆ in FIG. 5 or word lines 330₁ and 330₁₀ in FIG. 3. For example, the voltage (e.g., potential) of signal EdgeWL may be increased, e.g., from about 0V at a time t0, to the voltage Vwl_seed that may be maintained until time t2, as shown in FIG. 6. The voltage of signal EdgeWL may then be increased (e.g., ramped up), e.g. starting at time t2, from the voltage Vwl_seed until the voltage of signal EdgeWL reaches a bias voltage Vedge_bias, e.g., of about 3V, at time t3. Subsequently, the voltage of signal EdgeWL may be reduced (e.g., ramped down), e.g., to about 0V, from the voltage Vedge_bias. For example, the word lines receiving signal EdgeWL may be discharged from the voltage Vedge_bias.

The signal BL(sel.) may be applied to bit lines selectively coupled to strings having target memory cells, such as bit lines $508_1$ and $508_4$ in FIG. 5 or bit lines $108_1$ and $108_N$ in FIG. 1 or, for some embodiments, bit line 308 in FIG. 3. For example, signal BL(sel.) may be applied to bit lines coupled to two-dimensional arrays having a target memory cell, such as two-dimensional array $509_1$ coupled to bit line $508_1$ and the two-dimensional array coupled to bit line $508_4$ in FIG. 5 or two-dimensional arrays $109_1$ and $109_N$ respectively coupled to bit lines $108_1$ and $108_N$ in FIG. 1.

The voltage (e.g., potential) of signal BL(sel.) may be increased (e.g., ramped up), e.g., from about 0V, to a voltage Vbl_sel, e.g., of about 0.5V or about 1V for different bit lines coupled to different target memory cells, such as bit lines $508_1$ and $508_4$ in FIG. 5 or bit lines $108_1$ and $108_N$ in FIG. 1. For example, the voltage Vbl_sel. applied to a particular bit line might depend on a difference between a present and a desired threshold voltage (Vt) of the target memory cell coupled thereto. Voltage Vbl_sel may be about 0V to about 1V in some examples.

The voltage of signal BL(sel.) may be increased to voltage Vbl_sel while the word lines are at voltage Vwl_seed. The voltage of signal BL(sel.) may be reduced (e.g., ramped down) from the voltage Vbl_sel, e.g., so as to have a voltage of about 0V at time t4. For example, the bit lines receiving signal BL(sel.) may be discharged from the voltage Vbl_sel.

The signal BL(inh.) may be applied to bit lines selectively coupled to strings not having any memory cells targeted for programming, such as bit lines $508_2$ and $508_3$ in FIG. 5 or bit line $108_2$ in FIG. 1 or, for some embodiments, bit line 308 in FIG. 3. For example, signal BL(inh.) may be applied to bit lines coupled to two-dimensional arrays without any memory cells targeted for programming, such as the two-dimensional arrays respectively coupled to bit lines $508_2$ and $508_3$ in FIG. 5 or the two-dimensional array $109_2$ coupled to bit line $108_2$ in FIG. 1.

The voltage (e.g., potential) of signal BL(inh.) may be increased (e.g., ramped up), e.g., from about 0V, to a voltage Vbl_inh, e.g., of about 2.3V. For example, the voltage Vbl_inh may be greater than Vbl_sel for some embodiments. The voltage of signal BL(inh.) may be increased to voltage Vbl_inh while the word lines are at voltage Vwl_seed, as shown in FIG. 6. The voltage of signal BL(inh.) may be reduced (e.g., ramped down) from the voltage Vbl_inh, e.g., so as to have a voltage of about 0V at time t4. For example, the bit lines receiving signal BL(inh.) may be discharged from the voltage Vbl_inh.

The voltage (e.g., potential) of signal SRC may be increased (e.g. ramped up), e.g., from about 0V, to a voltage Vsrc, e.g., of about 1V, for a source, such as source 510 in FIG. 5, source 310 in FIG. 3, or common source 111 in FIG. 1. The voltage of signal SRC may be increased to voltage Vsrc while the word lines are at voltage Vwl_seed. The voltage of signal SRC may be reduced (e.g., ramped down) from the voltage Vsrc, e.g., so as to have a voltage of about 0V at time t4. For example, the source may be discharged from the voltage Vsrc.

The signal SGD(sel.) may be applied to a drain select line that is coupled to drain select gates that are coupled to strings containing target memory cells, such as the drain select line $522_3$ in FIG. 5 that is coupled to drain select gates that are coupled to bit lines $508_1$ and $508_4$ in FIG. 5 or the drain select line $122_2$ in FIG. 1 that is coupled to drain select gates $114_2$ coupled to bit lines $108_1$ and $108_N$. Note that drain select line receiving signal SGD(sel.) may also be coupled to drain select gates that are coupled to strings with no target memory cells, such as drain select line $522_3$ in FIG. 5 that is also coupled to drain select gates that are coupled to bit lines $508_2$ and $508_3$, drain select line 322 in FIG. 3 that is coupled to drain select gate 314, or the drain select line $122_2$ in FIG. 1 that is also coupled to the drain select gate $114_2$ coupled to bit line $108_2$. For example, signal SGD(sel.) may be applied to the drain select line $122_2$ in FIG. 1 that is coupled to the drain select gates $114_2$ that are coupled to the strings $102_2$ containing the target memory cells Target_1 and Target_2 and the string $102_2$ containing the untargeted memory cell UN_targeted.

The voltage (e.g., potential) of signal SGD(sel.) may be increased (e.g., ramped up), e.g., from about 0V at a time t0, to a voltage Vsgd_sel.1, e.g., that may range from 1V to 5V. The voltage of signal SGD(sel.) may be increased to the voltage Vsgd_sel.1 substantially concurrently (e.g., concurrently) with the voltages of signals WL(inh.), WL(sel.), and EdgeWL being increased to the voltage Vwl_seed. The voltage of signal SGD(sel.) may remain at the voltage Vsgd_sel.1 until a time t1, as shown in FIG. 6.

Starting at time t1, the voltage of signal SGD(sel.) may be decreased (e.g., ramped down) from voltage Vsgd_sel.1 until the voltage of signal SGD(sel.) is at a voltage Vsgd_sel.2 at time t2, e.g. where Vsgd_sel.2 may range from 1V to 4V and is less than Vsgd_sel.1. For example, the voltage of signal SGD(sel.) may be decreased from the voltage Vsgd_sel.1 to the voltage Vsgd_sel.2 before the voltage of signal WL(inh.) is increased from the voltage Vwl_seed to the voltage Vinh or the voltage Vbias, before the voltage of signal WL(sel.) is increased from the voltage Vwl_seed to the voltage Vpgm, and before the voltage of signal EdgeWL is increased from the voltage Vwl_seed to the voltage Vedge_bias. In other words, the voltage of signal WL(inh.) may be increased from the voltage Vwl_seed to the voltage Vinh or the voltage Vbias; the voltage of signal WL(sel.) may be increased from the voltage Vwl_seed to the voltage Vpgm; and the voltage of signal EdgeWL may be increased from the voltage Vwl_seed to the voltage Vedge_bias after the voltage of signal SGD(sel.) is decreased from the voltage Vsgd_sel.1 to the voltage Vsgd_sel.2, and thus while the voltage of signal SGD(sel.) is maintained at voltage Vsgd_sel.2.

The voltage of signal SGD(sel.) may be decreased (ramped down), e.g., to 0V, from the voltage Vsgd_sel.2, e.g., substantially concurrently (e.g., concurrently) with decreasing the voltage of signal BL(sel.) from voltage Vbl_sel, decreasing the voltage of signal BL(inh.) from voltage Vbl_inh, and decreasing the voltage of signal SRC from voltage Vsrc. For example, the drain select lines receiving the signal SGD(sel.) may be discharged from the voltage Vsgd_sel.2.

The signal SGD(inh.) may be applied to a drain select line that is coupled to drain select gates that are coupled to strings with no target memory cells. For example, signal SGD(inh.) may be applied to the drain select lines $522_1$ $522_2$, and $522_4$ in FIG. 5 that are coupled to drain select gates 514 that are coupled to bit lines $508_1$ to $508_4$, to drain select line 322 in FIG. 3 that is coupled to drain select gate 314 that is coupled to bit line 308, or to drain select lines $122_1$ and $122_M$ in FIG. 1 that are respectively coupled to drain select gates $114_1$ and $114_M$ that are coupled to bit lines $108_1$ to $108_N$.

The voltage (e.g., potential) of signal SGD(inh.) may be increased (e.g., ramped up), e.g., from about 0V at a time t0, to a voltage Vsgd_inh.1, e.g., that may range from 1V to 5V. For example, the drain select gates coupled to the drain select lines receiving signal SGD(inh.) may be on when the voltage of signal SGD(inh.) is at voltage Vsgd_inh.1. The voltage of signal SGD(inh.) may be increased to the voltage Vsgd_inh.1 substantially concurrently (e.g., concurrently) with the voltage of signal SGD(sel.) being increased to the voltage Vsgd_sel.1 and with the voltages of signals WL(inh.), WL(sel.), and EdgeWL being increased to the voltage Vwl_seed. The voltage of signal SGD(inh.) may remain at the voltage Vsgd_inh.1 until time t1, as shown in FIG. 6.

Starting at time t1, the voltage of signal SGD(inh.) may be decreased (ramped down) from voltage Vsgd_inh.1 until the voltage of signal SGD(inh.) is at a voltage Vsgd_inh.1+ at time t1+ so that drain select gates that are coupled to the drain select lines that are receiving signal SGD(inh.) are off at voltage Vsgd_inh.1+ at time t1+. That is, decreasing the voltage of signal SGD(inh.) from voltage Vsgd_inh.1 to voltage Vsgd_inh.1+ turns these drain select gates off. For example, the drain select gates that are coupled to the drain select lines that are receiving signal SGD(inh.) and that are coupled to bit lines receiving the signal BL(sel.) may be off when the difference of the voltage of signal SGD(inh.) minus the voltage of the signal BL(sel.) is less than the threshold voltage of these drain select gates, e.g., when the difference of Vsgd_inh.1+ minus Vbl_sel is less than the threshold voltage of these drain select gates.

Note that the differences used herein (unless otherwise noted) are the actual values of the differences and depend on the actual locations of the values of differences on a number line regardless of the magnitudes of the differences and include the signs of the differences. For example, a value of a first difference (e.g., −1V) that may be to the left of a value of a second difference (e.g., 0V) on the number line is less than the value of the second difference. In other words, the sign of the value of a difference counts such that negative values are less than positive values and such that the more negative a difference the lower the difference.

The drain select gates that are coupled to the drain select lines that are receiving signal SGD(inh.) and that are coupled to bit lines receiving the signal BL(inh.) may be off when the difference of the voltage of signal SGD(inh.) minus the voltage of the signal BL(inh.) is less than the threshold voltage of these drain select gates, e.g., when the difference of Vsgd_inh.1+ minus Vbl_inh is less than the threshold voltage of these drain select gates. Note, however, that Vbl_inh may be greater than Vbl_sel, meaning that the difference of Vsgd_inh.1+ minus Vbl_sel may be greater than the difference of Vsgd_inh.1+ minus Vbl_inh. Therefore, if the difference of Vsgd_inh.1+ minus Vbl_sel is less than the threshold voltage of the drain select gates that are coupled to the drain select lines that are receiving signal SGD(inh.) and that are coupled to bit lines receiving the signal BL(inh.) then so is difference of Vsgd_inh.1+ minus Vbl_inh. As such, the threshold voltage of drain select gates that are coupled to the drain select lines that are receiving signal SGD(inh.) and that are coupled to bit lines receiving the signal BL(inh.) may be selected so that these drain select gates are off when the difference of Vsgd_inh.1+ minus Vbl_sel is less than that threshold voltage.

The voltage of signal SGD(inh.) may be further decreased (ramped down), after (e.g., while) the drain select gates that are coupled to the drain select lines that are receiving signal SGD(inh.) are off, from voltage Vsgd_inh.1+ until the voltage of signal SGD(inh.) is at a voltage Vsgd_inh.2 at time t2, e.g., where voltage Vsgd_inh.2 may range from 0V to 1V and is less than voltage Vsgd_inh.1 and voltage Vsgd_inh.1+. For some embodiments, voltage Vsgd_inh.2 may be less than the voltages Vbl_sel and Vbl_inh.

Note that since the voltages Vbl_sel and Vbl_inh may be substantially constant while the voltage of signal SGD(inh.) is decreased, the differences of the voltage of signal SGD(inh.) minus the voltages of signals BL(sel.) and BL(inh.) may decrease as the voltage of signal SGD(inh.) is decreased.

This means that the differences of the voltage of signal SGD(inh.) minus the voltages of signals BL(sel.) and BL(inh.) may be decreased until the drain select gates that are coupled to the drain select lines that are receiving signal SGD(inh.) turn off. The differences of the voltage of signal SGD(inh.) minus the voltages of signals BL(sel.) and BL(inh.) may be further decreased after the drain select gates are turned off. For example, the difference of the voltage of signal SGD(inh.) minus the voltage of signal BL(sel.) may be decreased to a certain value, such as Vsgd_inh.2 minus Vbl_sel, and the difference of the voltage of signal SGD(inh.) minus the voltage of signal BL(inh.) may be decreased to a certain value, such as Vsgd_inh.2 minus Vbl_inh.

The voltage of signal SGD(inh.) may be decreased from Vsgd_inh.1 to Vsgd_inh.2, and thus the differences of the voltage of signal SGD(inh.) minus the voltages of signals BL(sel.) and BL(inh.) may be decreased to their certain values, and the drain select gates that are coupled to the drain select lines that are receiving signal SGD(inh.) may be off before the voltage of signal WL(inh.) is increased from the voltage Vwl_seed to the voltage Vinh or the voltage Vbias, before the voltage of signal WL(sel.) is increased from the voltage Vwl_seed to the voltage Vpgm, and before the voltage of signal EdgeWL is increased from the voltage Vwl_seed to the voltage Vedge_bias.

In other words, the voltage of signal WL(inh.) may be increased from the voltage Vwl_seed to the voltage Vinh or the voltage Vbias; the voltage of signal WL(sel.) may be increased from the voltage Vwl_seed to the voltage Vpgm; and the voltage of signal EdgeWL may be increased from the voltage Vwl_seed to the voltage Vedge_bias after the voltage of signal SGD(inh.) is decreased from the voltage Vsgd_inh.1 to the voltage Vsgd_inh.2 and after the drain select gates that are coupled to the drain select lines that are receiving signal SGD(inh.) are off and after the differences of the voltage of signal SGD(inh.) minus the voltages of signals BL(sel.) and BL(inh.) have been decreased to their certain values, and thus while the voltage of signal SGD(inh.) is maintained at voltage Vsgd_inh.2, while the drain select gates are off, and while the differences of the voltage of signal SGD(inh.) minus the voltages of signals BL(sel.) and BL(inh.) are at their certain values. For some embodiments, the voltage of signal SGD(inh.) may be decreased from voltage Vsgd_inh.1 to voltage Vsgd_inh.2 substantially concurrently (e.g., concurrently) with decreasing the voltage of signal SGD(sel.) from voltage Vsgd_sel.1 to voltage Vsgd_sel.2, as shown in FIG. 6.

The signal SGS may be applied substantially concurrently (e.g., concurrently) to source select lines that are coupled to source select gates that are coupled to strings with or without target memory cells. For example, signal SGS may be applied to common source select line 125 in FIG. 1, and thus substantially concurrently (e.g., concurrently) to source select lines $120_1$ to $120_N$ respectively in two-dimensional arrays $109_1$ to $109_N$. Signal SGS may be applied to source select line 320 that is coupled to source select gate 312 in FIG. 3 or to source select line 520 in FIG. 5 that is coupled to source select gates 512 that are coupled to strings 502 and source 510.

The voltage (e.g., potential) of signal SGS may be increased (e.g., ramped up), e.g., from about 0V at a time t0, to a voltage Vsgs1, e.g., that may range from 1V to 5V. For example, the source select gates coupled to the source select lines receiving signal SGS may be on when the voltage of signal SGS is at voltage Vsgs1. The voltage of signal SGS may be increased to the voltage Vsgs1 substantially concurrently (e.g., concurrently) with the voltage of signal SGD(inh.) being increased to the voltage Vsgd_inh.1, with the voltage of signal SGD(sel.) being increased to the voltage Vsgd_sel.1, and with the voltages of signals WL(inh.), WL(sel.), and EdgeWL being increased to the voltage Vwl_seed, as shown in FIG. 6. The voltage of signal SGS may remain at the voltage Vsgs1 until time t1.

Starting at time t1, the voltage of signal SGS may be decreased (ramped down) from voltage Vsgs1 until the voltage of signal SGS is at a voltage Vsgs1+ at time t1+ so that source select gates that are coupled to the source select lines that are receiving signal SGS are off at voltage Vsgs1+ at time t1+. That is, decreasing the voltage of signal SGS from voltage Vsgs1 to voltage Vsgs1+ may turn off the select gates. For example, the source select gates may be off when the difference of the voltage of signal SGS minus the voltage of the signal SRC is less than the threshold voltage of the source select gates, e.g., when the difference of Vsgs1+ minus Vsrc is less than the threshold voltage of the source select gates.

The voltage of signal SGS may be further decreased (ramped down) from voltage Vsgs1+, after (e.g., while) the select gates are off, until the voltage of signal SGS is at a voltage Vsgs2 at time t2, e.g., where Vsgs2 may range from 0V to 1V and is less than voltage Vsgs1 and voltage Vsgs1+. The voltage of signal SRC may be maintained at voltage Vsrc while the voltage of signal SGS is decreased from voltage Vsgs1 to voltage Vsgs2. For some embodiments, voltage Vsgs2 may be less than voltage Vsrc.

Since the voltage Vsrc remains substantially constant while the voltage of signal SGS is decreased, the difference of the voltage of signal SGS minus the voltage of signal SRC may decrease as the voltage of signal SGS is decreased. This means that the difference of the voltage of signal SGS minus the voltage of signal SRC may decrease until the source select gates that are coupled to the source select lines that are receiving signal SGS turn off and may continue to decrease while the select gates are turned off. For example, the difference of the voltage of signal SGS minus the voltage of signal SRC may decrease to a certain value, such as Vsgs2 minus Vsrc.

The voltage of signal SGS may be decreased from Vsgs1 to Vsgs2, and thus the source select gates receiving signal SGS may be off and the difference of the voltage of signal SGS minus the voltage of signal SRC may be at the certain value, before the voltage of signal WL(inh.) is increased from the voltage Vwl_seed to the voltage Vinh or the voltage Vbias, before the voltage of signal WL(sel.) is increased from the voltage Vwl_seed to the voltage Vpgm, and before the voltage of signal EdgeWL is increased from the voltage Vwl_seed to the voltage Vedge_bias. In other words, the voltage of signal WL(inh.) may be increased from the voltage Vwl_seed to the voltage Vinh or the voltage Vbias; the voltage of signal WL(sel.) may be increased from the voltage Vwl_seed to the voltage Vpgm; and the voltage of signal EdgeWL may be increased from the voltage Vwl_seed to the voltage Vedge_bias after the voltage of signal SGS is decreased from the voltage Vsgs1 to the voltage Vsgs2 and after the select gates are off, and thus while the voltage of signal SGS is maintained at voltage Vsgs2, the source select gates are off, and the difference of the voltage of signal SGS minus the voltage of signal SRC is at the certain value.

For some embodiments, the voltage of signal SGS may be decreased from voltage Vsgs1 to voltage Vsgs2 substantially concurrently (e.g., concurrently) with decreasing the voltage of signal SGD(inh.) from voltage Vsgd_inh.1 to voltage Vsgd_inh.2 and substantially concurrently (e.g., concurrently) with decreasing the voltage of signal SGD(sel.) from voltage Vsgd_sel.1 to voltage Vsgd_sel.2.

The voltage of signal SGS may be decreased (ramped down), e.g., to 0V, from the voltage Vsgs2, e.g., substantially concurrently (e.g., concurrently) with decreasing the voltage of signal SGD(sel.) from voltage Vsgd_sel.2, decreasing the voltage of signal BL(sel.) from voltage Vbl_sel, decreasing the voltage of signal BL(inh.) from voltage Vbl_inh, and decreasing the voltage of signal SRC from voltage Vsrc. For example, the source select lines receiving the signal SGS may be discharged from the voltage Vsgs2.

Note that the voltage of signal SGD(inh.) may be maintained at Vsgd_inh.2 while the voltage of signal SGS is decreased from the voltage Vsgs2, the voltage of signal SGD (sel.) is decreased from voltage Vsgd_sel.2, the voltage of signal BL(sel.) is decreased from voltage Vbl_sel, the voltage of signal BL(inh.) is decreased from voltage Vbl_inh, and the voltage of signal SRC is decreased from voltage Vsrc, as shown in FIG. 6.

For some embodiments, the voltages of signals SGD(sel.), SGD(inh.), and SGS may be respectively maintained at voltages Vsgd_sel.2, Vsgd_inh.2, and Vsgs2 while the voltage of signal WL(inh.) is increased from the voltage Vwl_seed to the voltage Vinh or the voltage Vbias, the voltage of signal WL(sel.) is increased from the voltage Vwl_seed to the voltage Vpgm, and the voltage of signal EdgeWL is increased from the voltage Vwl_seed to the voltage Vedge_bias, while the voltage of signal WL(inh.) is at the voltage Vinh or the voltage Vbias, the voltage of signal WL(sel.) is at the voltage Vpgm, and the voltage of signal EdgeWL is at the voltage Vedge_bias, and while the word lines receiving signal WL(inh.) are discharged from the voltage Vinh or the voltage Vbias, the word lines receiving signal WL(sel.) are discharged from the voltage Vpgm, and the word lines receiving signal EdgeWL are discharged from the voltage Vedge_bias (e.g., while the voltage of signal WL(inh.) is decreased from the voltage Vinh or the voltage Vbias to about 0V, the voltage of signal WL(sel.) is decreased from the voltage Vpgm to about 0V, and the voltage of signal EdgeWL is decreased from the voltage Vedge_bias to about 0V), as shown in FIG. 6.

Note that the drain select gates that are coupled to the drain select lines that are receiving signal SGD(inh.) and the source select gates that are coupled to the source select lines that are receiving signal SGS are turned off so that the channels of the strings of memory cells coupled between respective pairs of these drain and source select gates are floating while the voltage of signal WL(inh.) is increased from the voltage Vwl_seed to the voltage Vinh or the voltage Vbias, the voltage of signal WL(sel.) is increased from the voltage Vwl_seed to the voltage Vpgm, and the voltage of signal EdgeWL is increased from the voltage Vwl_seed to the voltage Vedge_bias, while the voltage of signal WL(inh.) is at the voltage Vinh or the voltage Vbias, the voltage of signal WL(sel.) is at the voltage Vpgm, and the voltage of signal EdgeWL is at the voltage Vedge_bias, and while the word lines receiving signal WL(inh.) are discharged from the voltage Vinh or the voltage Vbias, the word lines receiving signal WL(sel.) are discharged from the voltage Vpgm, and the word lines receiving signal EdgeWL are discharged from the voltage Vedge_bias (e.g., while the voltage of signal WL(inh.) is decreased from the voltage Vinh or the voltage Vbias to about 0V, the voltage of signal WL(sel.) is decreased from the voltage Vpgm to about 0V, and the voltage of signal EdgeWL is decreased from the voltage Vedge_bias to about 0V).

In terms of FIG. 3, the signal SGD (inh.) is applied to drain select gate 314, the signal SGS to source select gate 312, the signal SRC to source 310, and the signal BL(sel.) or BL(inh.) to bit line 308. For some embodiments, drain select gate 314 may be on when the voltage of signal SGD (inh.) is at voltage Vsgd_inh1, and source select gate 312 may be on when the voltage of signal SGS is at voltage Vsgs1, meaning that the portion 327 of pillar 305, and thus string 302, are electrically coupled to source/drain regions 340 and 345 and thus to source 310 and bit line 308. For some embodiments, the portion of the portion 327 of pillar 305 under drain select gate 314 may be about the voltage of the signal BL(sel.) or BL(inh.) applied to the bit line 308 when drain select gate 314 is on, and the portion of the portion 327 of pillar 305 under source select gate 312 may be about the voltage of the signal SRC applied to source 310 when source select gate 312 is on.

As the difference of the voltage of signal SGD (inh.) minus the voltage of signal BL(sel.) or signal BL(inh.) is decreased (e.g., by decreasing the voltage of signal SGD (inh.) while the voltage of signal BL(sel.) or signal BL(inh.) is substantially constant), drain select gate 314 turns off, electrically decoupling the portion 327 of pillar 305, and thus the channel region of string 302, from bit line 308. Similarly, as the difference of the voltage of signal SGS minus the voltage of signal SRC is decreased (e.g., by decreasing the voltage of signal SGS while the voltage of signal SRC is substantially constant), source select gate 312 turns off, electrically decoupling the portion 327 of pillar 305, and thus the channel region of string 302, from source 310. Note that source select gate 312 and drain select 314 may be turned off substantially concurrently for some embodiments.

Therefore, the portion 327 of pillar 305, and thus the channel region of string 302, may be floating when source select gate 312 and drain select 314 are off. The difference of the voltage of signal SGD (inh.) minus the voltage of signal BL(sel.) or signal BL(inh.) and the difference of the voltage of signal SGS minus the voltage of signal SRC may be further decreased while source select gate 312 and drain select gate 314 are off and the portion 327 of pillar 305 is floating and while the voltage of the signal BL(sel.) or BL(inh.) applied to bit line 308 is kept substantially constant and the voltage of signal SRC applied to source 310 is kept substantially constant. For example, the difference of the voltage of signal SGD (inh.) minus the voltage of signal BL(sel.) or signal BL(inh.) may be decreased to the certain value, such as Vsgd_inh.2 minus Vbl_sel or Vsgd_inh.2 minus Vbl_inh (FIG. 6), and the difference of the voltage of signal SGS minus the voltage of signal SRC may be decreased to the certain value, such as Vsgs2 minus Vsrc (FIG. 6).

Decreasing the difference of the voltage of signal SGD (inh.) minus the voltage of signal BL(sel.) or signal BL(inh.) to the certain value (e.g., by decreasing the voltage of signal SGD (inh.) while the voltage of signal BL(sel.) or signal BL(inh.) is substantially constant) while the drain select gate 314 is off couples down the voltage of the portion of the portion 327 of pillar 305 under drain select gate 314 (e.g., to a voltage less than the voltage of signal BL(sel.) or signal BL(inh.)) and causes the voltage across body-diffusion junction 354 to decrease (e.g., increase negatively), and thus body-diffusion junction 354 to become increasingly negatively biased, e.g., in a manner similar to that shown by curve 444 in FIG. 4. Note that the voltage applied to the drain select line 322 capacitively couples to the portion of the portion 327 of pillar 305 under drain select gate 314.

Decreasing the difference of the voltage of signal SGS minus the voltage of signal SRC to the certain value (e.g., by decreasing the voltage of signal SGS while the voltage of signal SRC is substantially constant) while the source select gate 312 is off couples down the voltage of the portion of the portion 327 of pillar 305 under source select gate 312 (e.g., to a voltage less than the voltage of signal SRC) and causes the voltage across body-diffusion junction 352 to decrease (e.g., increase negatively), and thus body-diffusion junction 352 to become increasingly negatively biased, e.g., in a manner similar to that shown by curve 444 in FIG. 4. Note that the voltage applied to the source select line 320 capacitively couples to the portion of the portion 327 of pillar 305 under source select gate 312.

Curve 444 and curve 440 in FIG. 4 are discussed further below in conjunction with FIG. 7. Note that curve 444 was obtained for a diffusion junction, such as body-diffusion junction 452 in FIG. 3, under a source select gate, such as source select gate 412. However substantially the same curve occurs for body-diffusion junction 354 under drain gate 414. Therefore, curve 444 will be taken to correspond to the voltage across either body-diffusion junction 354 or body-diffusion junction 352.

Figure 7:
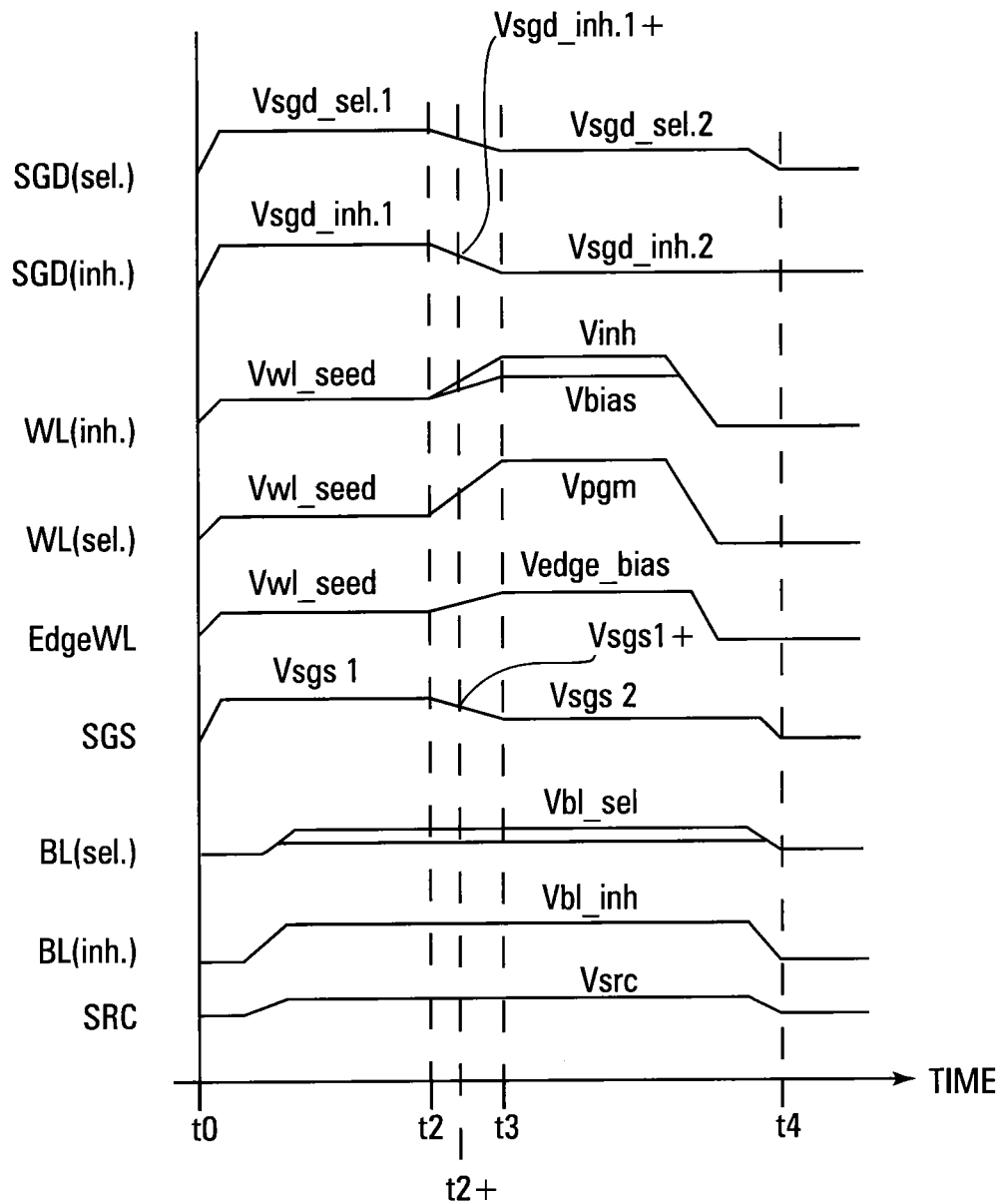
FIG. 7 illustrates waveforms for the signals that may be received by (e.g., may be applied to) a memory array during programming of that memory array, according to another embodiment.

FIG. 7 illustrates waveforms for the signals SGD(sel.), SGD (inh.), WL(inh), WL(sel.), EdgeWL, SGS, BL(sel.), BL(inh.), and SRC that may be received by (e.g., may be applied to) memory array 100 in FIG. 1, the structure in FIG. 3, or the memory array in FIG. 5 during a programming cycle for programming one or more target memory cells, such as the memory cells Target_1 and Target_2 in FIG. 1 or the circled target memory cell in FIG. 5. The waveforms for the signals WL(inh.), WL(sel.), EdgeWL, BL(sel.), BL(inh), and SRC may be as described above in conjunction with FIG. 6.

The voltage (e.g., potential) of signal SGD(sel.) may be increased (e.g., ramped up), e.g., from about 0V at a time t0, to the voltage Vsgd_sel.1. The voltage of signal SGD(sel.) may be increased to the voltage Vsgd_sel.1 substantially concurrently (e.g., concurrently) with the voltages of signals WL(inh.), WL(sel.), and EdgeWL being increased to the voltage Vwl_seed, as shown in FIG. 7. The voltage of signal SGD(sel.) may remain at the voltage Vsgd_sel.1 until time t2.

Starting at time t2, the voltage of signal SGD(sel.) may be decreased (e.g., ramped down) from voltage Vsgd_sel.1 until the voltage of signal SGD(sel.) is at the voltage Vsgd_sel.2 at time t3. For example, the voltage of signal SGD(sel.) may be decreased from the voltage Vsgd_sel.1 to the voltage Vsgd_sel.2 substantially concurrently (e.g., concurrently) with the voltage of signal WL(inh.) being increased from the voltage Vwl_seed to voltage Vinh or voltage Vbias, substantially concurrently (e.g., concurrently) with the voltage of signal WL(sel.) being increased from the voltage Vwl_seed to the voltage Vpgm, and substantially concurrently (e.g., concurrently) with the voltage of signal EdgeWL being increased from the voltage Vwl_seed to voltage Vedge_bias.

The voltage (e.g., potential) of signal SGD(inh.) may be increased (e.g., ramped up), e.g., from about 0V at a time t0, to voltage Vsgd_inh.1. The voltage of signal SGD(inh.) may be increased to the voltage Vsgd_inh.1 substantially concurrently (e.g., concurrently) with the voltage of signal SGD (sel.) being increased to the voltage Vsgd_sel.1 and with the voltages of signals WL(inh.), WL(sel.), and EdgeWL being increased to the voltage Vwl_seed, as shown in FIG. 7. The voltage of signal SGD(inh.) may remain at the voltage Vsgd_inh.1 until time t2. Note that the drain select gates coupled to the drain select lines receiving signal SGD(inh.) may be turned on when the voltage of signal SGD(sel.) is the voltage Vsgd_inh.1

Starting at time t2, the voltage of signal SGD(inh.) may be decreased (ramped down) from voltage Vsgd_inh.1 until the voltage of signal SGD(inh.) is at voltage Vsgd_inh.1+ at time t2+ so that drain select gates that are coupled to the drain select lines that are receiving signal SGD(inh.) are off at voltage Vsgd_inh.1+ at time t2+. That is, decreasing the voltage of signal SGD(inh.) from voltage Vsgd_inh.1 to voltage Vsgd_inh.1+ turns these drain select gates off.

The voltage of signal SGD(inh.) may be decreased (ramped down) from voltage Vsgd_inh.1+ until the voltage of signal SGD(inh.) is at voltage Vsgd_inh.2 at time t3. For example, the voltage of signal SGD(inh.) may be decreased from the voltage Vsgd_inh.1 to the voltage Vsgd_inh.2 substantially concurrently (e.g., concurrently) with the voltage of signal WL(inh.) being increased from the voltage Vwl_seed to the voltage Vinh or the voltage Vbias, substantially concurrently (e.g., concurrently) with the voltage of signal WL(sel.) being increased from the voltage Vwl_seed to the voltage Vpgm, and substantially concurrently (e.g., concurrently) with the voltage of signal EdgeWL being increased from the voltage Vwl_seed to voltage Vedge_bias, as shown in FIG. 7. This means that the drain select gates turn off while the voltage of signal WL(inh.) is being increased from the voltage Vwl_seed to the voltage Vinh or the voltage Vbias, while the voltage of signal WL(sel.) is being increased from the voltage Vwl_seed to the voltage Vpgm, and while the voltage of signal EdgeWL is being increased from the voltage Vwl_seed to voltage Vedge_bias.

Note that the difference of the voltage of signal SGD (inh.) minus the voltage of signal BL(sel.) is decreased to its certain value, and the difference of the voltage of signal SGD (inh.) minus the voltage of signal BL(inh.) is decreased to its certain value substantially concurrently (e.g., concurrently) with the voltage of signal WL(inh.) being increased from the voltage Vwl_seed to the voltage Vinh or the voltage Vbias, substantially concurrently (e.g., concurrently) with the voltage of signal WL(sel.) being increased from the voltage Vwl_seed to the voltage Vpgm, and substantially concurrently (e.g., concurrently) with the voltage of signal EdgeWL being increased from the voltage Vwl_seed to voltage Vedge_bias.

The voltage (e.g., potential) of signal SGS may be increased (e.g., ramped up), e.g., from about 0V at a time t0, to a voltage Vsgs1. The voltage of signal SGS may be increased to the voltage Vsgs1 substantially concurrently (e.g., concurrently) with the voltage of signal SGD(inh.) being increased to the voltage Vsgd_inh.1, with the voltage of signal SGD(sel.) being increased to the voltage Vsgd_sel.1, and with the voltages of signals WL(inh.), WL(sel.), and EdgeWL being increased to the voltage Vwl_seed, as shown in FIG. 7. The voltage of signal SGS may remain at the voltage Vsgs1 until time t2. Note that the source select gates that are coupled to the source select lines that are receiving the signal SGS may be on when the voltage of signal SGS is at voltage Vsgs1.

Starting at time t2, the voltage of signal SGS may be decreased (ramped down) from voltage Vsgs1 until the voltage of signal SGS is at voltage Vsgs1+ at time t2+ so that source select gates that are coupled to the source select lines that are receiving signal SGS are off at voltage Vsgs1+ at time t2+. That is, decreasing the voltage of signal SGS from voltage Vsgs1 to voltage Vsgs1+ may turn off the select gates.

The voltage of signal SGS may be decreased (ramped down) from voltage Vsgs1+ until the voltage of signal SGS is at voltage Vsgs2 at time t3. The voltage of signal SGS may be decreased from the voltage Vsgs1 to the voltage Vsgs2 substantially concurrently (e.g., concurrently) with the voltage of signal WL(inh.) being increased from the voltage Vwl_seed to voltage Vinh or voltage Vbias, substantially concurrently (e.g., concurrently) with the voltage of signal WL(sel.) being increased from the voltage Vwl_seed to the voltage Vpgm, and substantially concurrently (e.g., concurrently) with the voltage of signal EdgeWL being increased from the voltage Vwl_seed to voltage Vedge_bias. This means that the source select gates turn off while the voltage of signal WL(inh.) is being increased from the voltage Vwl_seed to voltage Vinh or voltage Vbias, while the voltage of signal WL(sel.) is being increased from the voltage Vwl_seed to the voltage Vpgm, and while the voltage of signal EdgeWL is being increased from the voltage Vwl_seed to voltage Vedge_bias.

Note that the difference of the voltage of signal SGS minus the voltage of signal SRC may be decreased to its certain value substantially concurrently (e.g., concurrently) with the voltage of signal WL(inh.) being increased from the voltage Vwl_seed to voltage Vinh or voltage Vbias, substantially concurrently (e.g., concurrently) with the voltage of signal WL(sel.) being increased from the voltage Vwl_seed to the voltage Vpgm, and substantially concurrently (e.g., concurrently) with the voltage of signal EdgeWL being increased from the voltage Vwl_seed to voltage Vedge_bias.

For some embodiments, the voltages of signals SGD(sel.), SGD(inh.), and SGS may be respectively maintained at voltages Vsgd_sel.2, Vsgd_inh.2, and Vsgs2 while the voltage of signal WL(inh.) is at the voltage Vinh or the voltage Vbias, the voltage of signal WL(sel.) is at the voltage Vpgm, and the voltage of signal EdgeWL is at the voltage Vedge_bias and while the word lines receiving signal WL(inh.) are discharged from the voltage Vinh or the voltage Vbias, the word lines receiving signal WL(sel.) are discharged from the voltage Vpgm, and the word lines receiving signal EdgeWL are discharged from the voltage Vedge_bias (e.g., while the voltage of signal WL(inh.) is decreased from the voltage Vinh or the voltage Vbias to about 0V, the voltage of signal WL(sel.) is decreased from the voltage Vpgm to about 0V, and the voltage of signal EdgeWL is decreased from the voltage Vedge_bias to about 0V), as shown in FIG. 7.

In terms of FIG. 3, decreasing the difference of the voltage of signal SGD(inh.) minus the voltage of signal BL(sel.) or signal BL(inh.) while the drain select gate 314 is off causes the voltage across body-diffusion junction 354 to decrease (e.g., increase negatively), and thus body-diffusion junction 354 to become increasingly negatively biased, e.g., in a manner similar to that shown by curve 444 in FIG. 4. Decreasing the difference of the voltage of signal SGS minus the voltage of signal SRC while the source select gate 312 is off causes the voltage across body-diffusion junction 352 to decrease (e.g., increase negatively), and thus body-diffusion junction 352 to become increasingly negatively biased, e.g., in a manner similar to that shown by curve 444 in FIG. 4.

Moreover, source select gate 312 and drain select gate 314 may turn off as voltages of the signals that are applied to word lines 330 are being increased to the voltages shown in FIG. 3. This pulls up the channel voltage of the portion of the portion 327 of pillar 305 under string 302, as shown by curve 440 in FIG. 4, while the source and drain select gates are off and the portion 327 of pillar 305 under string 302 is floating. For example, the channel voltage can increase (e.g., could be boosted) from about 0V to about 12V and then become uniform (e.g. constant) at about 12V in response to the voltages applied to the word lines (e.g., as the holes in the portion 327 of pillar 305 accumulate adjacent to body-diffusion junctions 352 and 354), e.g., in a manner similar to that shown by curve 440 in FIG. 4.

Curve 444 shows that the voltages across body-diffusion junctions 352 and 354 become increasingly more negative, and thus body-diffusion junctions 352 and 354 become increasingly more reversed biased, e.g., as the channel voltage is boosted, until the voltages across body-diffusion junctions 352 and 354 reach a certain value at point 446. The number of holes in the portion of the portion 327 of pillar 305 under source select gate 312 and in the portion of the portion 327 of pillar 305 under drain select gate 314 might continue to accumulate after reaching a certain number, e.g., while the channel voltage is at about 12V, and the voltages across body-diffusion junctions 352 and 354 might start to increase (e.g., become less negative) from point 446. However, the voltage across body-diffusion junction 352 and the voltage across body-diffusion junction 354 at point 446 may be sufficiently negative so as to keep the voltages across body-diffusion junctions 352 and 354 negative and body-diffusion junctions 352 and 354 reverse biased. As such, current flow across body-diffusion junction 352 from the portion 327 of pillar 305 to source 310 and current flow across body-diffusion junction 354 from the portion 327 of pillar 305 to bit line 308 can be prevented, and channel voltage can be maintained.

Note that FIG. 4 shows that the reverse bias of body-diffusion junctions 352 and 354 can decrease substantially concurrently with the potential of the portion 327 of pillar 305, and thus the potential of the channel of string 302, being boosted, such as for embodiments corresponding to FIG. 7, e.g., embodiments where the voltage of signal SGS may be decreased from the voltage Vsgs1 to the voltage Vsgs2 and the voltage of signal SGD(inh.) may be decreased from the voltage Vsgd_inh.1 to the voltage Vsgd_inh.2 substantially concurrently (e.g., concurrently) with the voltage of signal WL(inh.) being increased from the voltage Vwl_seed to voltage Vinh or voltage Vbias, substantially concurrently (e.g., concurrently) with the voltage of signal WL(sel.) being increased from the voltage Vwl_seed to the voltage Vpgm, and substantially concurrently (e.g., concurrently) with the voltage of signal EdgeWL being increased from the voltage Vwl_seed to voltage Vedge_bias. However, for embodiments corresponding to FIG. 6, where the voltage of signal SGS may be decreased from the voltage Vsgs1 to the voltage Vsgs2 and the voltage of signal SGD(inh.) may be decreased from the voltage Vsgd_inh.1 to the voltage Vsgd_inh.2 before the voltage of signal WL(inh.) is increased from the voltage Vwl_seed to voltage Vinh or voltage Vbias, before the voltage of signal WL(sel.) is increased from the voltage Vwl_seed to the voltage Vpgm, and before the voltage of signal EdgeWL is increased from the voltage Vwl_seed to voltage Vedge_bias, the voltage across the p-n junctions may decrease to point 446, and thus the reverse bias may be deceased, before the potential of the portion 327 of pillar 305, and thus the potential of the channel of string 302, is boosted.

Figure 8:
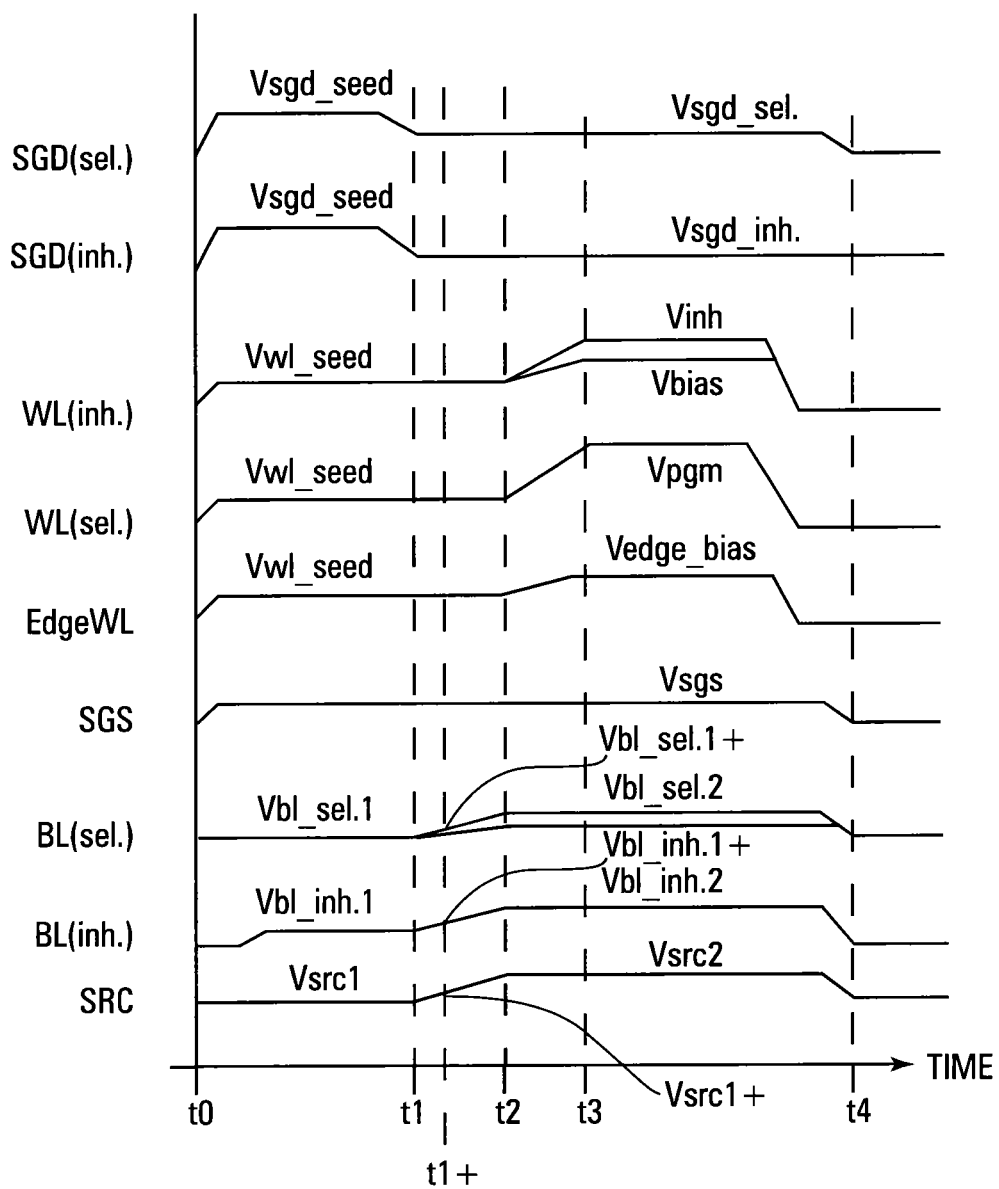
FIG. 8 illustrates waveforms for the signals that may be received by (e.g., may be applied to) a memory array during programming of that memory array, according to another embodiment.

FIG. 8 illustrates waveforms for the signals SGD(sel.), SGD (inh.), WL(inh), WL(sel.), EdgeWL, SGS, BL(sel.), BL(inh.), and SRC that may be received by (e.g., may be applied to) to memory array 100 in FIG. 1, the structure in FIG. 3, or the memory array in FIG. 5 during a programming cycle for programming one or more target memory cells, such as the memory cells Target_1 and Target_2 in FIG. 1 or the circled target memory cell in FIG. 5. The waveforms for the signals WL(inh), WL(sel.), and EdgeWL, may be as described above in conjunction with FIG. 6.

The voltage (e.g., potential) of signal SGD(sel.) may be increased (e.g., ramped up), e.g., from about 0V at a time t0, to a voltage Vsgd_seed, e.g., about 5V. The voltage of signal SGD(sel.) may be increased to the voltage Vsgd_seed substantially concurrently (e.g., concurrently) with the voltages of signals WL(inh.), WL(sel.), and EdgeWL being increased to the voltage Vwl_seed. The voltage of signal SGD(sel.) may be decreased (e.g., ramped down) from voltage Vsgd_seed until it reaches a voltage Vsgd_sel., e.g., about 2V, at time t1, as shown in FIG. 8. The voltage of signal SGD(sel.) may be decreased (e.g., ramped down) from voltage Vsgd_sel., e.g., it reaches about 0V at time t4.

For some embodiments, signal SGD(sel.) in FIG. 8 may have the substantially the same (e.g., the same) waveform as described above for signal SGD(sel.) in conjunction with FIG. 6 or as described above in conjunction FIG. 7. For example, the voltage of signal SGD(sel.) may be decreased from voltage Vsgd_sel.1 to voltage Vsgd_sel.2 before (FIG. 6) the voltage of signal WL(inh.) is increased from the voltage Vwl_seed to the voltage Vinh or the voltage Vbias, the voltage of signal WL(sel.) is increased from the voltage Vwl_seed to the voltage Vpgm, and the voltage of signal EdgeWL is increased from the voltage Vwl_seed to the voltage Vedge_bias, or the voltage of signal SGD(sel.) may be decreased from voltage Vsgd_sel.1 to voltage Vsgd_sel.2 substantially concurrently (e.g. concurrently) with (FIG. 7) the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias.

The voltage (e.g., potential) of signal SGD(inh.) may be increased (e.g., ramped up), e.g., from about 0V at a time t0, to voltage Vsgd_seed. The voltage of signal SGD(inh.) may be increased to the voltage Vsgd_seed substantially concurrently (e.g., concurrently) with the voltages of signals WL(inh.), WL(sel.), and EdgeWL being increased to the voltage Vwl_seed and with the voltage of signal SGD(sel.) being increased to the voltage Vsgd_seed. The voltage of signal SGD(inh.) may be decreased (e.g., ramped down) from voltage Vsgd_seed until it reaches a voltage Vsgd_inh., e.g., about 0V to about 0.5V, at time t2.

For some embodiments, signal SGD(inh.) in FIG. 8 may have the substantially the same (e.g., the same) waveform as described above for signal SGD(inh.) in conjunction with FIG. 6 or as described above in conjunction FIG. 7. For example, the voltage of signal SGD(inh.) may be ramped down from voltage Vsgd_inh.1 to voltage Vsgd_inh.2 before (FIG. 6) the voltage of signal WL(inh.) is increased from the voltage Vwl_seed to the voltage Vinh or the voltage Vbias, the voltage of signal WL(sel.) is increased from the voltage Vwl_seed to the voltage Vpgm, and the voltage of signal EdgeWL is increased from the voltage Vwl_seed to the voltage Vedge_bias, or the voltage of signal SGD(inh.) may be ramped down from voltage Vsgd_inh.1 to voltage Vsgd_inh.2 substantially concurrently (e.g. concurrently) with (FIG. 7) the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias.

The voltage (e.g., potential) of signal SGS may be increased (e.g., ramped up), e.g., from about 0V at a time t0, to voltage Vsgs, e.g., about 1V. The voltage of signal SGS may be decreased from voltage Vsgs, e.g., to about 0V, substantially concurrently (e.g., concurrently) with decreasing the voltage of signal SGD(sel.) from Vsgd_sel., as shown in FIG. 8.

For some embodiments, signal SGS in FIG. 8 may have the substantially the same (e.g., the same) waveform as described above for signal SGS in conjunction with FIG. 6 or as described above in conjunction FIG. 7. For example, the voltage of signal SGS may be ramped down from voltage Vsgs1 to voltage Vsgs 2 before (FIG. 6) the voltage of signal WL(inh.) is increased from the voltage Vwl_seed to the voltage Vinh or the voltage Vbias, the voltage of signal WL(sel.) is increased from the voltage Vwl_seed to the voltage Vpgm, and the voltage of signal EdgeWL is increased from the voltage Vwl_seed to the voltage Vedge_bias, or the voltage of signal SGS may be ramped down from voltage Vsgs1 to voltage Vsgs 2 substantially concurrently (e.g. concurrently) with (FIG. 7) the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias.

The voltage (e.g., potential) of signal BL(sel.) may be maintained at a voltage Vbl_sel.1, e.g., of about 0V, from time t0 to time t1. For example, the voltage of signal BL(sel.) may be maintained at voltage Vbl_sel.1 while the voltages of signals SGD(sel.) and SGD(inh.) are being increased to and are at voltage Vsgd_seed and while the voltages of signals WL(inh.), WL(sel.), and EdgeWL are being increased to and are at voltage Vwl_seed, as shown in FIG. 8. For some embodiments, the difference of Vsgd_inh. minus Vbl_sel.1 may be such that the drain select gates receiving signal SGD (inh.) may be on.

Starting at time t1, the voltage of signal BL(sel.) may be increased from voltage Vbl_sel.1 until the voltage of signal BL(sel.) is at voltage Vbl_sel.1+ at time t1+, as shown in FIG. 8, so that the drain select gates coupled to the drain select lines receiving signal SGD(inh.) are off at voltage Vbl_sel.1+ at time t1+. That is, increasing the voltage of signal BL(sel.) from voltage Vbl_sel.1 to voltage Vbl_sel.1+ may turn off the drain select gates. For example, the drain select gates may be off when the difference of Vsgd_inh. minus Vbl_sel.1+ is less than the threshold voltage of the drain select gates.

The voltage of signal BL(sel.) may be increased from voltage Vbl_sel.1+ until the voltage of signal BL(sel.) is at voltage Vbl_sel.2, e.g., ranging from about 0.2V to about 1V, at time t2, as shown in FIG. 8. Note that the voltage Vbl_sel.2 applied to a particular bit line might depend on a difference between a present and a desired threshold voltage (Vt) of the target memory cell coupled thereto. As such, some bit lines might receive one value of the voltage Vbl_sel.2, while others might receive another value of the voltage Vbl_sel.2. For some embodiments, the voltage Vsgd_inh. may be less than voltage Vbl_sel.2.

Since the voltage of signal SGD(inh.) may be substantially constant while increasing the voltage of signal BL(sel.), the difference of the voltage of signal SGD(inh) minus the voltage of signal BL(sel.) may decrease as the voltage of signal BL(sel.) increases. Therefore, the difference of the voltage of signal SGD(inh.) minus the voltage of signal BL(sel.) may be decreased until the drain select gates turn off and further decreased after the drain select gates turn off. For example, the difference of the voltage of signal SGD(inh.) minus the voltage of signal BL(sel.) may be decreased to a certain value, such as Vsgd_inh. minus Vbl_sel.2.

For some embodiments, the voltage of signal BL(sel.) may be increased from voltage Vbl_sel.1 to voltage Vbl_sel.2, and thus the drain select gates may be off and the difference of the voltage of signal SGD(inh.) minus the voltage of signal BL(sel.) may be at its certain value, before the voltage of signal WL(inh.) is increased from the voltage Vwl_seed to the voltage Vinh or the voltage Vbias, before the voltage of signal WL(sel.) is increased from the voltage Vwl_seed to the voltage Vpgm, and before the voltage of signal EdgeWL is increased from the voltage Vwl_seed to the voltage Vedge_bias, as shown in FIG. 8. In other words, the voltage of signal WL(inh.) may be increased from the voltage Vwl_seed to the voltage Vinh or the voltage Vbias; the voltage of signal WL(sel.) may be increased from the voltage Vwl_seed to the voltage Vpgm; and the voltage of signal EdgeWL may be increased from the voltage Vwl_seed to the voltage Vedge_bias after the voltage of signal BL(sel.) is increased from the voltage Vbl_sel.1 to the voltage Vbl_sel.2 and after the drain select gates are off, and thus while the voltage of signal BL(sel.) is maintained at voltage Vbl_sel.2, while the drain select gates are off, and while the difference of the voltage of signal SGD(inh.) minus the voltage of signal BL(sel.) is at its certain value.

The voltage of signal BL(sel.) may be maintained at voltage Vbl_sel.2, and thus the drain select gates may be off and the difference of the voltage of signal SGD(inh.) minus the voltage of signal BL(sel.) may be at its certain value, while the voltage of signal WL(inh.) is increased to, is at, and is decreased from the voltage Vinh or the voltage Vbias, the voltage of signal WL(sel.) is increased to, is at, and is decreased from the voltage Vpgm, and the voltage of signal EdgeWL is increased to, is at, and is decreased from the voltage Vedge_bias, as shown in FIG. 8. The voltage of signal BL(sel.) may be decreased from voltage Vbl_sel.2, e.g., to about 0V, substantially concurrently with (e.g., concurrently with) decreasing the voltage of signal SGD(sel.) from Vsgd_sel.

The voltage (e.g., potential) of signal BL(inh.) may be may be increased (e.g., ramped up), e.g., from about 0V at a time t0, to a voltage Vbl_inh.1, e.g., about 0V to about 1.5V. Note that Vbl_inh.1 might be about 0V for some embodiments, so the voltage of signal BL(inh.) would not be increased to Vbl_inh.1, but maintained at Vbl_inh.1, starting at time t0 for such embodiments. For example, the voltage of signal BL(inh.) may be maintained at or increased to voltage Vbl_inh.1 while the voltages of signals SGD(sel.) and SGD (inh.) are at voltage Vsgd_seed and while the voltages of signals WL(inh), WL(sel.), and EdgeWL are at voltage Vwl_seed. For some embodiments, the difference of Vsgd_inh. minus Vbl_inh.1 may be such that the drain select gates receiving signal SGD(inh.) may be on.

Starting at time t1, the voltage of signal BL(inh.) may be increased from voltage Vbl_inh.1 until the voltage of signal BL(inh.) is at voltage Vbl_inh.1+ at time t1+, as shown in FIG. 8, so that the drain select gates coupled to the drain select lines receiving signal SGD(inh.) are off at voltage Vbl_inh.1+ at time t1+. That is, increasing the voltage of signal BL(inh.) from voltage Vbl_inh.1 to voltage Vbl_inh.1+ may turn off the drain select gates. For example, the drain select gates may be off when the difference of Vsgd_inh. minus Vbl_inh.1+ is less than the threshold voltage of the drain select gates.

The voltage of signal BL(inh.) may be increased from voltage Vbl_inh.1+ until the voltage of signal BL(inh.) is at voltage Vbl_inh.2, e.g., ranging from about 1V to about 2.3V, at time t2, as shown in FIG. 8. For some embodiments, the voltage Vsgd_inh. may be less than voltage Vbl_inh.2.

Since the voltage of signal SGD(inh.) may be substantially constant while increasing the voltage of signal BL(inh.), the difference of the voltage of signal SGD(inh.) minus the voltage of signal BL(inh.) may decrease as the voltage of signal BL(inh) increases. Therefore, the difference of the voltage of signal SGD(inh.) minus the voltage of signal BL(inh.) may be decreased until the drain select gates turn off and further decreased after the drain select gates turn off. For example, the difference of the voltage of signal SGD(inh.) minus the voltage of signal BL(inh.) may be decreased to a certain value, such as Vsgd_inh. minus Vbl_inh.2

For some embodiments, the voltage of signal BL(inh.) may be increased from voltage Vbl_inh.1 to voltage Vbl_inh.2 substantially concurrently (e.g., concurrently) with the voltage of signal BL(sel.) being increased from voltage Vbl_sel.1 to voltage Vbl_sel.2. The voltage of signal BL(inh.) may be increased from voltage Vbl_inh.1 to voltage Vbl_inh.2, and thus the drain select gates may be off and the difference of the voltage of signal SGD(inh.) minus the voltage of signal BL(inh.) may be at its certain value, before the voltage of signal WL(inh.) is increased from the voltage Vwl_seed to the voltage Vinh or the voltage Vbias, before the voltage of signal WL(sel.) is increased from the voltage Vwl_seed to the voltage Vpgm, and before the voltage of signal EdgeWL is increased from the voltage Vwl_seed to the voltage Vedge_bias, as shown in FIG. 8.

The voltage of signal BL(inh.) may be maintained at voltage Vbl_inh.2 and thus the drain select gates may be off and the difference of the voltage of signal SGD(inh.) minus the voltage of signal BL(inh.) may be at its certain value, while the voltage of signal BL(sel.) is at voltage Vbl_sel.2, while the voltage of signal WL(inh.) is increased to, is at, and is decreased from the voltage Vinh or the voltage Vbias, while the voltage of signal WL(sel.) is increased to, is at, and is decreased from the voltage Vpgm, and while the voltage of signal EdgeWL is increased to, is at, and is decreased from the voltage Vedge_bias. In other words, the voltage of signal WL(inh.) may be increased from the voltage Vwl_seed to the voltage Vinh or the voltage Vbias, the voltage of signal WL(sel.) may be increased from the voltage Vwl_seed to the voltage Vpgm, and the voltage of signal EdgeWL may be increased from the voltage Vwl_seed to the voltage Vedge_bias after the voltage of signal BL(inh.) is increased from the voltage Vbl_inh.1 to the voltage Vbl_inh.2 and the drain select gates are off, and thus while the voltage of signal BL(inh.) is maintained at voltage Vbl_inh.2, the drain select gates are off, and the difference of the voltage of signal SGD(inh.) minus the voltage of signal BL(inh.) is at its certain value. The voltage of signal BL(inh.) may be decreased from voltage Vbl_inh.2, e.g., to about 0V, substantially concurrently (e.g., concurrently) with decreasing the voltage of signal BL(sel.) from voltage Vbl_sel.2 and the voltage of signal SGD(sel.) from Vsgd_sel., as shown in FIG. 8.

The voltage (e.g., potential) of signal SRC may be maintained at a voltage Vsrc1, e.g., of about 0V to about 1.5V, from time t0 to time t1. For example, the voltage of signal SRC may be maintained at voltage Vsrc1 while the voltages of signals SGD(sel.) and SGD(inh.) are being increased to and are at voltage Vsgd_seed, while the voltages of signals WL(inh.), WL(sel.), and EdgeWL being increased to and are at voltage Vwl_seed, while the voltage of signal BL(sel.) is at Vbl_sel.1, and while the voltage of signal BL(inh.) being increased to and/or is at Vbl_inh.1, as shown in FIG. 8.

Starting at time t1, the voltage of signal SRC may be increased from voltage Vsrc1 until the voltage of signal SRC is at a voltage Vsrc1+ at time t1+, so that the source select gates coupled to the source select lines receiving signal SRC are off at voltage Vsrc1+ at time t1+. For example, the source select gates may be off when the difference of Vsgs minus voltage Vsrc1+ is less than the threshold voltage of the source select gates. That is, increasing the voltage of signal SRC from voltage Vsrc1 to voltage Vsrc1+ may turn off the source select gates.

The voltage of signal SRC may be increased from voltage Vsrc1+ until the voltage of signal SRC is at a voltage Vsrc2, e.g., of about 1V to about 2.3V, at time t2. For some embodiments, voltage Vsrc2 may be less than the voltage Vsgs.

Since the voltage of signal SGS may be substantially constant while increasing the voltage of signal SRC, the difference of the voltage of signal SGS minus the voltage of signal SRC may decrease as the voltage of signal SGS increases. Therefore, the difference of the voltage of signal SGS minus the voltage of signal SRC may be decreased until the source select gates turn off and further decreased after the source select gates turn off. For example, the difference of the voltage of signal SGS minus the voltage of signal SRC may be decreased to a certain value, such as Vsgs minus Vsrc2.

For some embodiments, the voltage of signal SRC may be increased from voltage Vsrc1 to voltage Vsrc2 substantially concurrently (e.g., concurrently) with the voltage of signal BL(sel.) being increased from voltage Vbl_sel.1 to voltage Vbl_sel.2; substantially concurrently (e.g., concurrently) with the voltage of signal BL(inh.) being increased from voltage Vbl_inh.1 to voltage Vbl_inh.2; and before the voltage of signal WL(inh.) is increased from the voltage Vwl_seed to the voltage Vinh or the voltage Vbias, before the voltage of signal WL(sel.) is increased from the voltage Vwl_seed to the voltage Vpgm, and before the voltage of signal EdgeWL is increased from the voltage Vwl_seed to the voltage Vedge_bias, as shown in FIG. 8. In other words, the voltage of signal WL(inh.) may be increased from the voltage Vwl_seed to the voltage Vinh or the voltage Vbias; the voltage of signal WL(sel.) may be increased from the voltage Vwl_seed to the voltage Vpgm; and the voltage of signal EdgeWL may be increased from the voltage Vwl_seed to the voltage Vedge_bias after the voltage of signal SRC is increased from the voltage Vsrc1 to the voltage Vsrc2 and the source select gates are off, and thus while the voltage of signal SRC is maintained at voltage Vsrc2, the source select gates are off, and the difference of the voltage of signal SGS minus the voltage of signal SRC is at its certain value.

Note that the difference of the voltage of signal SGS minus the voltage of signal SRC may be decreased to its certain value before the voltage of signal WL(inh.) is increased from the voltage Vwl_seed to the voltage Vinh or the voltage Vbias, before the voltage of signal WL(sel.) is increased from the voltage Vwl_seed to the voltage Vpgm, and before the voltage of signal EdgeWL is increased from the voltage Vwl_seed to the voltage Vedge_bias.

The voltage of signal SRC may be maintained at voltage Vsrc2 while the voltage of signal BL(inh.) is at voltage Vbl_inh.2, the voltage of signal BL(sel.) is at voltage Vbl_sel.2, the voltage of signal WL(inh.) is increased to, is at, and is decreased from the voltage Vinh or the voltage Vbias, the voltage of signal WL(sel.) is increased to, is at, and is decreased from the voltage Vpgm, and the voltage of signal EdgeWL is increased to, is at, and is decreased from the voltage Vedge_bias. The voltage of signal SRC may be decreased from voltage Vsrc2, e.g., to about 0V, substantially concurrently (e.g., concurrently) with decreasing the voltage of signal BL(inh.) from voltage Vbl_inh.2, decreasing the voltage of signal BL(sel.) from voltage Vbl_sel.2, the voltage of signal SGD(sel.) from Vsgd_sel., and the voltage of signal SGD(inh.) from Vsgd_inh, as shown in FIG. 8.

In terms of FIG. 3, drain select gate 314 may be on when the voltage of the signal BL(sel.) applied to the bit line 308 is at Vbl_sel.1 or the voltage of the signal BL(inh.) applied to the bit line 308 is at Vbl_inh.1 and the voltage of signal SGD (inh) applied to drain select gate 314 is at voltage Vsgd_inh., and source select gate 312 may be on when the voltage of signal SRC applied to source 310 is at voltage Vsrc1 and the voltage applied to source select gate 312 is at Vsgs, meaning that the portion 327 of pillar 305, and thus string 302, are electrically coupled to source/drain regions 340 and 345, and thus to bit line 308 and source 310. For some embodiments, the portion of the portion 327 of pillar 305 under drain select gate 314 may be about the voltage of the signal BL(sel.) or BL(inh.) applied to the bit line 308 when drain select gate 314 is on, and the portion of the portion 327 of pillar 305 under source select gate 312 may be about the voltage of the signal SRC applied to source 310 when source select gate 312 is on.

As the difference of the voltage of signal SGD (inh.) minus the voltage of signal BL(sel.) or signal BL(inh.) is decreased (e.g., by increasing the voltage of signal BL(sel.) or signal BL(inh.) while the voltage of signal SGD (inh.) is substantially constant), drain select gate 314 turns off, electrically decoupling the portion 327 of pillar 305, and thus the channel region of string 302, from bit line 308. Similarly, as the difference of the voltage of signal SGS minus the voltage of signal SRC is decreased (e.g., by increasing the voltage of signal SRC while the voltage of signal SGS is substantially constant), source select gate 312 turns off, electrically decoupling the portion 327 of pillar 305, and thus the channel region of string 302, from source 310.

Therefore, the portion 327 of pillar 305, and thus the channel region of string 302, may be floating when source select gate 312 and drain select gate 314 are off. The difference of the voltage of signal SGD (inh.) minus the voltage of signal BL(sel.) or signal BL(inh.) and the difference of the voltage of signal SGS minus the voltage of signal SRC may be further decreased while source select gate 312 and drain select gate 314 are off and the portion 327 of pillar 305 is floating and while the voltage of the signal SGD(inh.) applied to drain select gate 314 is substantially constant and voltage the signal SGS applied to source select gate 312 is substantially constant. For example, the difference of the voltage of signal SGD (inh.) minus the voltage of signal BL(sel.) may be further decreased to its certain value, or the difference of the voltage of signal SGD (inh.) minus the voltage of signal BL(inh.) may be further decreased to its certain value, and the difference of the voltage of signal SGS minus the voltage of signal SRC may be further decreased of its certain value.

Decreasing the difference of the voltage of signal SGD (inh.) minus the voltage of signal BL(sel.) or signal BL(inh.) (e.g., by increasing the voltage of signal BL(sel.) or signal BL(inh.) while the voltage of signal SGD (inh.) is substantially constant) while the drain select gate 314 is off couples up the voltage of bit line 308, and thus the voltage of the source/drain region 345 coupled to bit line 308, (e.g., to a voltage greater than the voltage of signal SGD(inh.) applied to drain select gate 314) and causes the voltage across body-diffusion junction 354 to decrease (e.g., to increase negatively), and thus body-diffusion junction 354 to become increasingly negatively biased, e.g., in a manner similar to that shown by curve 454 in FIG. 4. Decreasing the difference of the voltage of signal SGS minus the voltage of signal SRC (e.g., by increasing the voltage of signal SRC while the voltage of signal SGS is substantially constant) while the source select gate 312 is off couples up the voltage of source 310 (e.g., to a voltage greater than the voltage of signal SGS) and causes the voltage across body-diffusion junction 352 to decrease (e.g., to increase negatively), and thus body-diffusion junction 352 to become increasingly negatively biased, e.g., in a manner similar to that shown by curve 454 in FIG. 4.

Curve 454 in FIG. 4 was obtained for a diffusion junction, such as body-diffusion junction 452 in FIG. 3, under a source select gate, such as source select gate 412. However substantially the same curve occurs for body-diffusion junction 354 under drain gate 414. Therefore, curve 454 will be taken to correspond to the voltage across either body-diffusion junction 354 or body-diffusion junction 352.

Figure 9:
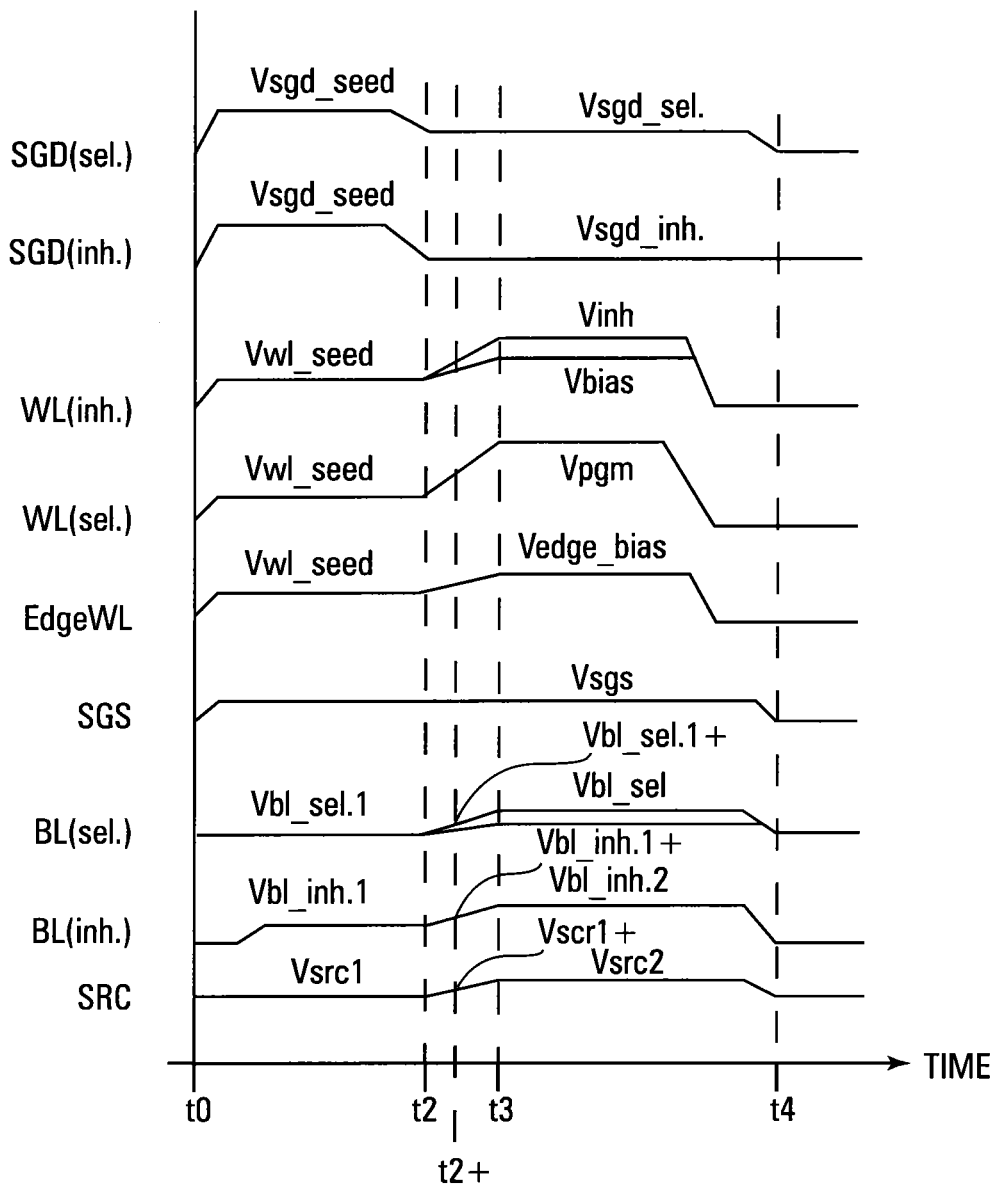
FIG. 9 illustrates waveforms for the signals that may be received by (e.g., may be applied to) a memory array during programming of that memory array, according to another embodiment.

FIG. 9 illustrates waveforms for the signals SGD(sel.), SGD (inh.), WL(inh.), WL(sel.), EdgeWL, SGS, BL(sel.), BL(inh.), and SRC that may be received by (e.g., may be applied to) to memory array 100 in FIG. 1, the structure in FIG. 3, or the memory array in FIG. 5 during a programming cycle for programming one or more target memory cells, such as the memory cells Target_1 and Target_2 in FIG. 1 or the circled target memory cell in FIG. 5. The waveforms for the signals WL(inh), WL(sel.), and EdgeWL in FIG. 9, may be as described above in conjunction with FIG. 6, and the waveforms for the signals SGD(sel.), SGD(inh.) and SGS in FIG. 9 may be substantially the same as (e.g., the same as) described above in conjunction with FIG. 8.

For some embodiments, signal SGD(sel.) in FIG. 9 may have the substantially the same (e.g., the same) waveform as described above in conjunction with FIG. 6 or as described above in conjunction FIG. 7. For example, the voltage of signal SGD(sel.) may be ramped down from voltage Vsgd_sel.1 to voltage Vsgd_sel.2 before (FIG. 6) the voltage of signal WL(inh.) is increased from the voltage Vwl_seed to the voltage Vinh or the voltage Vbias, the voltage of signal WL(sel.) is increased from the voltage Vwl_seed to the voltage Vpgm, and the voltage of signal EdgeWL is increased from the voltage Vwl_seed to the voltage Vedge_bias, or the voltage of signal SGD(sel.) may be ramped down from voltage Vsgd_sel.1 to voltage Vsgd_sel.2 substantially concurrently (e.g. concurrently) with (FIG. 7) the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias.

For some embodiments, signal SGD(inh.) in FIG. 9 may have the substantially the same (e.g., the same) waveform as described above in conjunction with FIG. 6 or as described above in conjunction FIG. 7. For example, the voltage of signal SGD(inh.) may be ramped down from voltage Vsgd_inh.1 to voltage Vsgd_inh.2 before (FIG. 6) the voltage of signal WL(inh.) is increased from the voltage Vwl_seed to the voltage Vinh or the voltage Vbias, the voltage of signal WL(sel.) is increased from the voltage Vwl_seed to the voltage Vpgm, and the voltage of signal EdgeWL is increased from the voltage Vwl_seed to the voltage Vedge_bias, or the voltage of signal SGD(inh.) may be ramped down from voltage Vsgd_inh.1 to voltage Vsgd_inh.2 substantially concurrently (e.g. concurrently) with (FIG. 7) the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias.

For some embodiments, signal SGS in FIG. 9 may have the substantially the same (e.g., the same) waveform as described above in conjunction with FIG. 6 or as described above in conjunction FIG. 7. For example, the voltage of signal SGS may be decreased from voltage Vsgs1 to voltage Vsgs 2 before (FIG. 6) the voltage of signal WL(inh.) is increased from the voltage Vwl_seed to the voltage Vinh or the voltage Vbias, the voltage of signal WL(sel.) is increased from the voltage Vwl_seed to the voltage Vpgm, and the voltage of signal EdgeWL is increased from the voltage Vwl_seed to the voltage Vedge_bias, or the voltage of signal SGS may be decreased from voltage Vsgs1 to voltage Vsgs 2 substantially concurrently (e.g. concurrently) with (FIG. 7) the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias.

Note that the voltage of signal SGD(sel.) in FIG. 9 may be decreased (e.g., ramped down) from voltage Vsgd_seed until it reaches voltage Vsgd_sel. at time t2, and the voltage of signal SGD(inh.) in FIG. 9 may be decreased (e.g., ramped down) from voltage Vsgd_seed until it reaches voltage Vsgd_inh. at time t2.

The voltage (e.g., potential) of signal BL(sel.) may be maintained at voltage Vbl_sel.1 from time t0 to time t2. For example, the voltage of signal BL(sel.) may be maintained at voltage Vbl_sel.1 while the voltages of signals SGD(sel.) and SGD(inh.) are being increased to and are at voltage Vsgd_seed and while the voltages of signals WL(inh), WL(sel.), and EdgeWL are being increased to and are at voltage Vwl_seed, as shown in FIG. 9.

Starting at time t2, the voltage of signal BL(sel.) may be increased from voltage Vbl_sel.1 until the voltage of signal BL(sel.) is at voltage Vbl_sel.1+ at time t2+, as shown in FIG. 9, so that the drain select gates coupled to the drain select lines receiving signal SGD(inh.) are off at voltage Vbl_sel.1+ at time t2+. For example, the drain select gates may turn off as voltage of signal BL(sel.) is increased from voltage Vbl_sel.1 to voltage Vbl_sel.1+.

Starting at time t2+, the voltage of signal BL(sel.) may be increased, while the drain select gates are off, from voltage Vbl_sel.1+ until the voltage of signal BL(sel.) is at voltage Vbl_sel.2 at time t3. For some embodiments, the voltage of signal BL(sel.) may be increased from voltage Vbl_sel.1 to voltage Vbl_sel.2, and thus the difference of the voltage of signal SGD(inh.) minus the voltage of signal BL(sel.) may be decreased, substantially concurrently (e.g., concurrently) with the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias, as shown in FIG. 9. Note that the drain select gates may turn off as the voltage of signal WL(inh.) is being increased from the voltage Vwl_seed to the voltage Vinh or the voltage Vbias, the voltage of signal WL(sel.) is being increased from the voltage Vwl_seed to the voltage Vpgm, and the voltage of signal EdgeWL is being increased from the voltage Vwl_seed to the voltage Vedge_bias.

The voltage of signal BL(sel.) may be maintained at voltage Vbl_sel.2 and the drain select gates may be off while the voltage of signal WL(inh.) is at and is decreased from the voltage Vinh or the voltage Vbias, the voltage of signal WL(sel.) is at and is decreased from the voltage Vpgm, and the voltage of signal EdgeWL is at and is decreased from the voltage Vedge_bias, as shown in FIG. 9. The voltage of signal BL(sel.) may be decreased from voltage Vbl_sel.2, e.g., to about 0V, substantially concurrently with (e.g., concurrently with) decreasing the voltage of signal SGD(sel.) from Vsgd_sel.

The voltage (e.g., potential) of signal BL(inh.) may be may be increased (e.g., ramped up), e.g., from about 0V at a time t0, to voltage Vbl_inh.1, as shown in FIG. 9. Starting at time t2, the voltage of signal BL(inh.) may be increased from voltage Vbl_inh.1 until the voltage of signal BL(inh.) is at voltage Vbl_inh.1+ at time t2+, so that the drain select gates coupled to the drain select lines receiving signal SGD(inh.) are off at voltage Vbl_inh.1+ at time t2+. For example, the drain select gates may turn off as voltage of signal BL(inh.) is increased from voltage Vbl_inh.1 to voltage Vbl_inh.1+.

Starting at time t2+, the voltage of signal BL(inh.) may be increased, while the drain select gates are off, from voltage Vbl_inh.1+ until the voltage of signal BL(inh.) is at voltage Vbl_inh.2 at time t3. For some embodiments, the voltage of signal BL(inh.) may be increased from voltage Vbl_inh.1 to voltage Vbl_inh.2, and thus the difference of the voltage of signal SGD(inh.) minus the voltage of signal signal BL(inh.) may be decreased, substantially concurrently (e.g., concurrently) with the voltage of signal BL(sel.) being increased from voltage Vbl_sel.1 to voltage Vbl_sel.2, the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias, as shown in FIG. 9. Therefore, the drain select gates may turn off while the voltage of signal WL(inh.) is being increased from the voltage Vwl_seed to the voltage Vinh or the voltage Vbias, the voltage of signal WL(sel.) is being increased from the voltage Vwl_seed to the voltage Vpgm, and the voltage of signal EdgeWL is being increased from the voltage Vwl_seed to the voltage Vedge_bias.

The voltage of signal BL(inh.) may be maintained at voltage Vbl_inh.2 and the drain select gates may be off while the voltage of signal BL(sel.) is at voltage Vbl_sel.2, the voltage of signal WL(inh.) is at and is decreased from the voltage Vinh or the voltage Vbias, the voltage of signal WL(sel.) is at and is decreased from the voltage Vpgm, and the voltage of signal EdgeWL is at and is decreased from the voltage Vedge_bias, as shown in FIG. 9. The voltage of signal BL(inh.) may be decreased from voltage Vbl_inh.2, e.g., to about 0V, substantially concurrently (e.g., concurrently) with decreasing the voltage of signal BL(sel.) from voltage Vbl_sel.2 and decreasing the voltage of signal SGD(sel.) from Vsgd_sel., as shown in FIG. 9.

The voltage (e.g., potential) of signal SRC may be maintained at voltage Vsrc1 while the voltages of signals SGD (sel.) and SGD(inh.) are being increased to and are at voltage Vsgd_seed, while the voltages of signals WL(inh.), WL(sel.), and EdgeWL are being increased to and are at voltage Vwl_seed, while the voltage of signal BL(sel.) is at Vbl_sel.1, and while the voltage of signal BL(inh.) is being increased to and/or is at Vbl_inh.1, as shown in FIG. 9.

Starting at time t2, the voltage of signal SRC may be increased from voltage Vsrc1 until the voltage of signal SRC voltage is at voltage Vsrc1+ at time t2+ so that the source select gates that are coupled to the source select lines that are receiving signal SRC are off at voltage Vsrc1+ at time t2+. For example, the source select gates may turn off as the voltage of signal SRC is increased from voltage Vsrc1 to voltage Vsrc1+ at time t2+

Starting at time t2+, the voltage of signal SRC may be increased from voltage Vsrc1+ until the voltage of signal SRC voltage is at Vsrc2 at time t3. For some embodiments, the voltage of signal SRC may be increased from voltage Vsrc1 to voltage Vsrc1, and thus the difference of the voltage of signal SRC minus the voltage of signal SRC may be decreased, substantially concurrently (e.g., concurrently) with the voltage of signal BL(sel.) being increased from voltage Vbl_sel.1 to voltage Vbl_sel.2, the voltage of signal BL(inh.) being increased from voltage Vbl_inh.1 to voltage Vbl_inh.2, the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias, as shown in FIG. 9. Therefore, the source select gates may turn off while the voltage of signal WL(inh.) is being increased from the voltage Vwl_seed to the voltage Vinh or the voltage Vbias, the voltage of signal WL(sel.) is being increased from the voltage Vwl_seed to the voltage Vpgm, and the voltage of signal EdgeWL is being increased from the voltage Vwl_seed to the voltage Vedge_bias.

The voltage of signal SRC may be maintained at voltage Vsrc2 and the source select gates may be off while the voltage of signal BL(inh.) is at voltage Vbl_inh.2, the voltage of signal BL(sel.) is at voltage Vbl_sel.2, the voltage of signal WL(inh.) is at and is decreased from the voltage Vinh or the voltage Vbias, the voltage of signal WL(sel.) is at and is decreased from the voltage Vpgm, and the voltage of signal EdgeWL is at and is decreased from the voltage Vedge_bias. The voltage of signal SRC may be decreased from voltage Vsrc2, e.g., to about 0V, substantially concurrently (e.g., concurrently) with decreasing the voltage of signal BL(inh.) from voltage Vbl_inh.2, decreasing the voltage of signal BL(sel.) from voltage Vbl_sel.2, and decreasing the voltage of signal SGD(sel.) from Vsgd_sel., as shown in FIG. 9.

In terms of FIG. 3, decreasing the difference of the voltage of signal SGD(inh.) minus the voltage of signal BL(sel.) or signal BL(inh.) while the drain select gate 314 is off causes the voltage across body-diffusion junction 354 to decrease (e.g., increase negatively), and thus body-diffusion junction 354 to become increasingly negatively biased, e.g., in a manner similar to that shown by curve 454 in FIG. 4. Decreasing the difference of the voltage of signal SGS minus the voltage of signal SRC while the source select gate 312 is off causes the voltage across body-diffusion junction 352 to decrease (e.g., increase negatively), and thus body-diffusion junction 352 to become increasingly negatively biased, e.g., in a manner similar to that shown by curve 454 in FIG. 4.

Moreover, source select gate 312 and drain select gate 314 may turn off as the voltages of the signals that are applied to word lines 330 are being increased to the voltages shown in FIG. 3. This pulls up the channel voltage on the portion of the portion 327 of pillar 305 under string 302, as shown by curve 450 in FIG. 4, while the source and drain select gates are off and the portion 327 of pillar 305 under string 302 is floating. For example, the channel voltage can increase (e.g., could be boosted) from about 0V to about 12V and then become uniform (e.g. constant) at about 12V in response to the voltages applied to the word lines (e.g., as the holes in the portion 327 of pillar 305 accumulate adjacent to body-diffusion junctions 352 and 354), e.g., in a manner similar to that shown by curve 450 in FIG. 4.

Curve 454 shows that the voltages across body-diffusion junctions 352 and 354 become increasingly more negative, and thus body-diffusion junctions 352 and 354 become increasingly more reversed biased, e.g., as the channel voltage is boosted, until the voltages across body-diffusion junctions 352 and 354 reach point 446. The number of holes in the portion of the portion 327 of pillar 305 under source select gate 312 and in the portion of the portion 327 of pillar 305 under drain select gate 314 might continue to accumulate after reaching a certain number, e.g., while the channel voltage is at about 12V, and the voltages across body-diffusion junctions 352 and 354 might start to increase (e.g., become less negative) from point 446. However, the voltages across body-diffusion junctions 352 and 354 at point 446 may be sufficiently negative so as to keep the voltages across body-diffusion junctions 352 and 354 negative and body-diffusion junctions 352 and 354 reverse biased. As such, current flow across body-diffusion junction 352 from the portion 327 of pillar 305 to source 310 and current flow across body-diffusion junction 354 from the portion 327 of pillar 305 to bit line 308 can be prevented, and channel voltage can be maintained.

Note that FIG. 4 shows that the reverse bias of the p-n junctions can decrease substantially concurrently with the potential of the portion 327 of pillar 305, and thus the potential of the channel of string 302, being boosted, such as for embodiments corresponding to FIG. 9, e.g., embodiments where the voltage of signal BL(sel.) may be increased from voltage Vbl_sel.1 to voltage Vbl_sel.2, the voltage of signal BL(inh.) may be increased from voltage Vbl_inh.1 to voltage Vbl_inh.2, and the voltage of signal SRC may be increased from voltage Vsrc1 to voltage Vsrc1 substantially concurrently (e.g., concurrently) with the voltage of signal WL(inh.) being increased from the voltage Vwl_seed to the voltage Vinh or the voltage Vbias, the voltage of signal WL(sel.) being increased from the voltage Vwl_seed to the voltage Vpgm, and the voltage of signal EdgeWL being increased from the voltage Vwl_seed to the voltage Vedge_bias. However, for embodiments corresponding to FIG. 8, where the voltage of signal BL(sel.) may be increased from voltage Vbl_sel.1 to voltage Vbl_sel.2, the voltage of signal BL(inh.) may be increased from voltage Vbl_inh.1 to voltage Vbl_inh.2, and the voltage of signal SRC may be increased from voltage Vsrc1 to voltage Vsrc1 before the voltage of signal WL(inh.) is increased from the voltage Vwl_seed to voltage Vinh or voltage Vbias, before the voltage of signal WL(sel.) is increased from the voltage Vwl_seed to the voltage Vpgm, and before the voltage of signal EdgeWL is increased from the voltage Vwl_seed to voltage Vedge_bias, the voltage across the p-n junctions may decrease to point 446, and thus the reverse bias may be deceased, before the potential of the portion 327 of pillar 305, and thus the potential of the channel of string 302, is boosted.

For other embodiments, where signals SGS, SGD(inh), and SGD(sel.) have substantially the same (e.g., the same) waveforms as in FIG. 6 or 7 instead of those in FIG. 8 or 9, the voltage of signal SRC may be increased from voltage Vsrc1 to voltage Vsrc1 (FIG. 8 or 9); the voltage of signal BL(sel.) may be increased from voltage Vbl_sel.1 to voltage Vbl_sel.2 (FIG. 8 or 9); and the voltage of signal BL(inh.) may be increased from voltage Vbl_inh.1 to voltage Vbl_inh.2 (FIG. 8 or 9) substantially concurrently (e.g., concurrently) with the voltage of signal SGS being decreased from voltage Vsgs1 to voltage Vsgs2 (FIGS. 6 and 7), substantially concurrently (e.g., concurrently) with the voltage of signal SGD(inh.) being decreased from voltage Vsgd_inh.1 to voltage Vsgd_inh.2 (FIGS. 6 and 7), and substantially concurrently (e.g., concurrently) with the voltage of signal SGD(sel.) being decreased from voltage Vsgd_sel.1 to voltage Vsgd_sel.2 (FIGS. 6 and 7).

Therefore, the difference of the voltage of signal SGD(inh) minus the voltage of signal BL(sel.) or signal BL(inh.) may be decreased by decreasing the voltage of signal SGD(inh.) substantially concurrently (e.g., concurrently) with increasing the voltage of signal BL(sel.) or BL(inh.) until drain select gate 314 turns off. The difference of the voltage of signal SGD(inh.) minus the voltage of signal BL(sel.) or signal BL(inh.) may be decreased further while drain select gate 314 is off by further decreasing the voltage of signal SGD(inh.) substantially concurrently (e.g., concurrently) with increasing the voltage of signal BL(sel.) or BL(inh.) while drain select gate 314 is off, so as to decrease (increase negatively) the voltage across body-diffusion junction 354, and thus to increase the reverse bias of body-diffusion junction 354, after drain select gate 314 is off. For example, the difference of the voltage of signal SGD(inh.) minus the voltage of signal BL(sel.) might be decreased to the value Vsgd_inh.2 (FIGS. 6 and 7) minus Vbl_sel.2 (FIGS. 8 and 9), and the difference of the voltage of signal SGD(inh.) minus the voltage of signal BL(inh.) might be decreased to the value Vsgd_inh.2 (FIGS. 6 and 7) minus Vbl_inh.2 (FIGS. 8 and 9).

Similarly, the difference of the voltage of signal SGS minus the voltage of signal SRC may be decreased by decreasing the voltage of signal SGS substantially concurrently (e.g., concurrently) with increasing the voltage of signal SRC until source select gate 312 turns off. The difference of the voltage of signal SGS minus the voltage of signal SRC may be decreased further after source select gate 312 is off by further decreasing the voltage of signal SGS substantially concurrently (e.g., concurrently) with increasing the voltage of signal SRC after source select gate 312 is off, so as to decrease (increase negatively) the voltage across body-diffusion junction 352, and thus to increase the reverse bias of body-diffusion junction 352, after source select gate 312 is off. For example, the difference of the voltage of signal SGS minus the voltage of signal SRC may be decreased to the value Vsgs2 (FIGS. 6 and 7) minus Vsrc2 (FIGS. 8 and 9).

The absolute magnitudes, relative magnitudes, differences, and/or durations (e.g., time) of the signals shown and/or discussed herein are not meant to be limiting but are intended to be illustrative in describing one or more embodiments according to the present disclosure.

Figure 10:
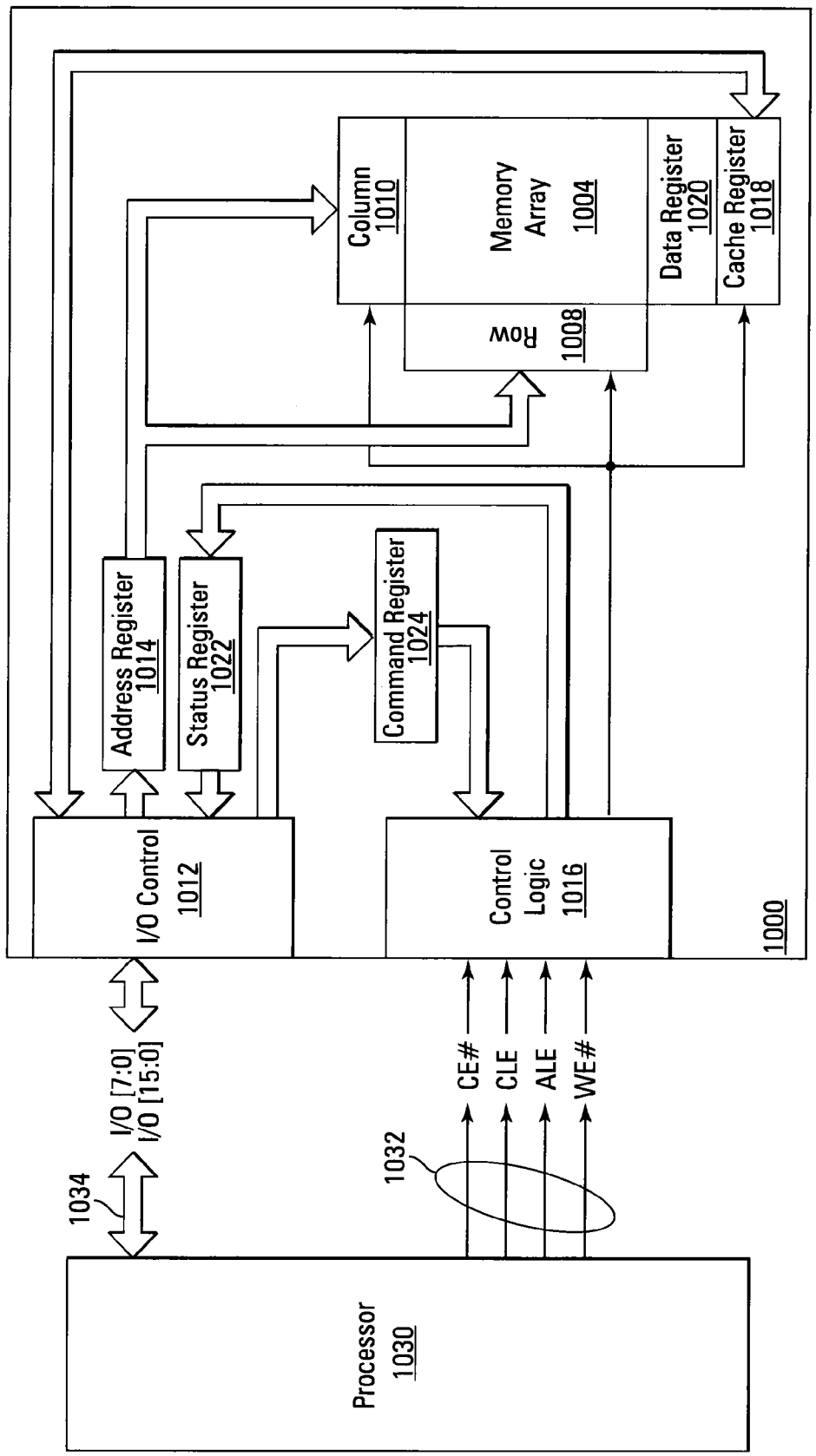
FIG. 10 is a simplified block diagram of a memory system, according to an embodiment.

FIG. 10 is a simplified block diagram of a NAND flash memory device 1000 in communication with a processor 1030 as part of an electronic system, according to an embodiment. The processor 1030 may be a memory controller or other external host device. Memory device 1000 includes an array of memory cells 1004. Memory array 1004 may be configured as memory array 100 in FIG. 1 and may include substantially vertical (e.g., vertical) strings (e.g., NAND strings) of series-coupled memory cells that may be located adjacent to (e.g., on) substantially vertical (e.g., vertical) semiconductor pillars, such as shown in FIGS. 2A and 2B and FIG. 3.

A row decoder 1008 and a column decoder 1010 are provided to decode address signals. Address signals are received and decoded to access memory array 1004. Memory device 1000 also includes input/output (I/O) control circuitry 1012 to manage input of commands, addresses, and data to the memory device 1000 as well as output of data and status information from the memory device 1000. An address register 1014 is in communication with I/O control circuitry 1012, and row decoder 1008 and column decoder 1010, to latch the address signals prior to decoding. A command register 1024 is in communication with I/O control circuitry 1012 and control logic 1016 to latch incoming commands.

Control logic 1016 controls operation of memory device 1000. Control logic 1016 controls access to the memory array 1004 in response to the commands and generates status information for the external processor 1030. The control logic 1016 is in communication with row decoder 1008 and column decoder 1010 to control the row decoder 1008 and column decoder 1010 in response to the addresses.

Control logic 1016 is also in communication with a cache register 1018. Cache register 1018 latches data, either incoming or outgoing, as directed by control logic 1016 to temporarily store data while the memory array 1004 is busy writing or reading, respectively, other data. During a write operation, data is passed from the cache register 1018 to data register 1020 for transfer to the memory array 1004; then new data is latched in the cache register 1018 from the I/O control circuitry 1012. During a read operation, data is passed from the cache register 1018 to the I/O control circuitry 1012 for output to the external processor 1030; then new data is passed from the data register 1020 to the cache register 1018. A status register 1022 is in communication with I/O control circuitry 1012 and control logic 1016 to latch the status information for output to the processor 1030.

Memory device 1000 receives control signals at control logic 1016 from processor 1030 over a control link 1032. The control signals may include at least a chip enable CE#, a command latch enable CLE, an address latch enable ALE, and a write enable WE#. Memory device 1000 receives command signals (which represent commands), address signals (which represent addresses), and data signals (which represent data) from processor 1030 over a multiplexed input/output (I/O) bus 1034 and outputs data to processor 1030 over I/O bus 1034.

For example, the commands are received over input/output (I/O) pins [7:0] of I/O bus 1034 at I/O control circuitry 1012 and are written into command register 1024. The addresses are received over input/output (I/O) pins [7:0] of bus 1034 at I/O control circuitry 1012 and are written into address register 1014. The data are received over input/output (I/O) pins [7:0] for an 8-bit device or input/output (I/O) pins [15:0] for a 16-bit device at I/O at control circuitry 1012 and are written into cache register 1018. The data are subsequently written into data register 1020 for programming memory array 1004. For another embodiment, cache register 1018 may be omitted, and the data are written directly into data register 1020. Data are also output over input/output (I/O) pins [7:0] for an 8-bit device or input/output (I/O) pins [15:0] for a 16-bit device.

For some embodiments, control logic 1016 is configured to allow memory device 1000 to perform the methods disclosed herein. For example, for some embodiments, control logic may be configured to allow memory device 1000 to decrease a difference of a voltage applied to a first select gate minus a voltage applied to a source coupled to the first select gate while the first select gate is off, to decrease a difference of a voltage applied to a second select gate minus a voltage applied to a data line coupled to the second select gate while the second select gate is off, and to increase a voltage applied to a selected access line that is coupled to an untargeted memory cell in a string of memory cells coupled to the first and second select gates to a program voltage after or substantially concurrently with decreasing the difference of the voltage applied to the first select gate minus the voltage applied to the source and after or substantially concurrently with decreasing the difference of the voltage applied to the second select gate minus the voltage applied to the data line.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of programming a memory array, comprising:
   decreasing a difference of a voltage applied to a first select gate minus a voltage applied to a source coupled to the first select gate while the first select gate is off;
   decreasing a difference of a voltage applied to a second select gate minus a voltage applied to a data line coupled to the second select gate while the second select gate is off; and
   increasing a voltage of a signal applied to a selected access line that is coupled to an untargeted memory cell, not targeted for programming, in a string of memory cells coupled to the first and second select gates to a program voltage after or substantially concurrently with decreasing the difference of the voltage applied to the first select gate minus the voltage applied to the source and after or substantially concurrently with decreasing the difference of the voltage applied to the second select gate minus the voltage applied to the data line.

2. The method of claim 1, wherein a voltage difference across a diffusion junction under the first select gate becomes more negative as the difference of the voltage applied to the first select gate minus the voltage applied to the source decreases, and wherein a voltage difference across a diffusion junction under the second select gate becomes more negative as the difference of the voltage applied to the second select gate minus the voltage applied to the data line decreases.

3. The method of claim 2, wherein a reverse bias of the diffusion junction under the first select gate increases as the voltage difference across the diffusion junction under the first select gate decreases, and wherein a reverse bias of the diffusion junction under the second select gate increases as the voltage difference across the diffusion junction under the second select gate decreases.

4. The method of claim 3, wherein the string of memory cells coupled to the first and second select gates is formed over a semiconductor pillar, wherein one end of the semiconductor pillar forms a portion of the diffusion junction under the first select gate and an opposite end of the semiconductor pillar forms a portion of the diffusion junction under the second select gate.

5. The method of claim 4, wherein the semiconductor pillar floats when the first and second select gates are off.

6. The method of claim 1, wherein decreasing the difference of the voltage applied to the first select gate minus the voltage applied to the source comprises decreasing the voltage applied to the first select gate while the voltage applied to the source is substantially constant, increasing the voltage applied to the source while the voltage applied to the first select gate is substantially constant, or decreasing the voltage applied to the first select gate substantially concurrently with increasing the voltage applied to the source.

7. The method of claim 1, wherein decreasing the difference of the voltage applied to the second select gate minus the voltage applied to the data line comprises decreasing the voltage applied to the second select gate while the voltage applied to the data line is substantially constant, increasing the voltage applied to the data line while the voltage applied to the second select gate is substantially constant, or decreasing the voltage applied to the second select gate substantially concurrently with increasing the voltage applied to the data line.

8. The method of claim 1, further comprising increasing voltages of signals applied to unselected access lines coupled other memory cells in the string of memory cells coupled to the first and second select gates after or substantially concurrently with decreasing the difference of the voltage applied to the first select gate minus the voltage applied to the source and after or substantially concurrently with decreasing the difference of the voltage applied to the second select gate minus the voltage applied to the data line.

9. The method of claim 8, wherein increasing the voltages of signals applied to unselected access lines coupled the other memory cells in the string of memory cells coupled to the first and second select gates and increasing the voltage of the signal applied to the selected access line that is coupled to the untargeted memory cell in the string of memory cells coupled to the first and second select gates to the program voltage acts to boost a channel voltage of the string of memory cells coupled to the first and second select gates while the first and second select gates are off.

10. The method of claim 1, wherein decreasing the difference of the voltage applied to the first select gate minus the voltage applied to the source coupled to the first select gate while the first select is off and decreasing the difference of the voltage applied to the second select gate minus the voltage applied to the data line coupled to the second select gate while the second select is off occur substantially concurrently.

11. The method of claim 1, further comprising turning the first and second select gates off substantially concurrently before decreasing the difference of the voltage applied to the first select gate minus the voltage applied to the source coupled to the first select gate and before decreasing the difference of the voltage applied to the second select gate minus the voltage applied to the data line coupled to the second select gate.

12. A method of programming a memory array, comprising:
   decreasing a voltage of a signal applied to a first select gate from a first voltage of the signal applied to the first select gate to a second voltage of the signal applied to the first select gate, wherein the first select gate is coupled between a string of memory cells and a source, and wherein the first select gate is on at the first voltage of the signal applied to the first select gate and turns off before the voltage of the signal applied to the first select gate reaches the second voltage of the signal applied to the first select gate;
   decreasing a voltage of a signal applied to a second select gate from a first voltage of the signal applied to the second select gate to a second voltage of the signal applied to the second select gate, wherein the second select gate is coupled between the string of memory cells and a data line, and wherein the second select is on at the first voltage of the signal applied to the second select gate and turns off before the voltage of the signal applied to the second select gate reaches the second voltage of the signal applied to the second select gate; and
   increasing a voltage of a signal applied to a selected access line that is coupled to an untargeted memory cell, not targeted for programming, in the string of memory cells to a program voltage after or substantially concurrently with decreasing the voltage of the signal applied to the first select gate from the first voltage of the signal applied to the first select gate to the second voltage of the signal applied to the first select gate and after or substantially concurrently with decreasing the voltage of the signal applied to the second select gate from the first voltage of the signal applied to the second select gate to the second voltage of the signal applied to the second select gate.

13. The method of claim 12, wherein a difference of the second voltage of the signal applied to the first select gate minus a voltage of a signal applied to the source is less than a threshold voltage of the first select gate and a difference of the second voltage of the signal applied to the second select gate minus a voltage of a signal applied to the data line is less than a threshold voltage of the second select gate.

14. The method of claim 12, wherein a voltage of a signal applied to the source is substantially constant or is increasing while decreasing the voltage of the signal applied to the first select gate from the first voltage of the signal applied to the first select gate to the second voltage of the signal applied to the first select gate.

15. The method of claim 12, wherein a voltage of a signal applied to the source is greater than the second voltage of the signal applied to the first select gate and less than the first voltage of the signal applied to the first select gate.

16. The method of claim 12, wherein a voltage of a signal applied to the data line is substantially constant or is increasing while decreasing the voltage of the signal applied to the second select gate from the first voltage of the signal applied to the second select gate to the second voltage of the signal applied to the second select gate.

17. The method of claim 12, wherein a voltage of a signal applied to the data line is greater than the second voltage of the signal applied to the second select gate and less than the first voltage of the signal applied to the second select gate.

18. The method of claim 12, wherein the string of memory cells comprises a first string of memory cells on a first semiconductor pillar, and further comprising decreasing a voltage of a signal applied to a third select gate coupled between a second string of memory cells on a second semiconductor pillar and the data line from a first voltage of the signal applied to the third select gate to a second voltage of the signal applied to the third select gate so that the voltage of the signal applied to the selected access line is increased to the program voltage after or while the voltage of the signal applied to the third select gate is decreased from the first voltage of the signal applied to the third select gate to the second voltage of the signal applied to the third select gate, wherein the second string of memory cells comprises a target memory cell, targeted for programming, coupled to the selected access line.

19. The method of claim 12, further comprising increasing voltages of signals applied to unselected selected access lines coupled to other memory cells in the string of memory cells after or substantially concurrently with decreasing the voltage of the signal applied to the first select gate from the first voltage of the signal applied to the first select gate to the second voltage of the signal applied to the first select gate and after or substantially concurrently with decreasing the voltage of the signal applied to the second select gate from the first voltage of the signal applied to the second select gate to the second voltage of the signal applied to the second select gate.

20. The method of claim 12, wherein decreasing the voltage of the signal applied to the first select gate from the first voltage of the signal applied to the first select gate to the second voltage of the signal applied to the first select gate occurs substantially concurrently with decreasing the voltage of the signal applied to the second select gate from the first voltage of the signal applied to the second select gate to the second voltage of the signal applied to the second select gate.

21. A method of programming a memory array, comprising:

increasing a voltage of a signal applied to a source from a first voltage of the signal applied to the source to a second voltage of the signal applied to the source, wherein the source is coupled to a first select gate, wherein the first select gate is on when the voltage of the signal applied to the source is at the first voltage of the signal applied to the source and the first select gate turns off before the voltage of the signal applied to the source reaches the second voltage of the signal applied to the source;

increasing a voltage of a signal applied to a data line from a first voltage of the signal applied to the data line to a second voltage of the signal applied to the data line, wherein the data line is coupled to a second select gate, wherein the second select gate is on when the voltage of the signal applied to the data line is at the first voltage of the signal applied to the data line and the second select gate turns off before the voltage of the signal applied to the data line reaches the second voltage of the signal applied to the data line; and increasing a voltage of a signal applied to a selected access line that is coupled to an untargeted memory cell, not targeted for programming, in a string of memory cells coupled to the first and second select gates to a program voltage after or substantially concurrently with increasing the voltage of the signal applied to the source from the first voltage of the signal applied to the source to the second voltage of the signal applied to the source and after or substantially concurrently with increasing the voltage of the signal applied to the data line from the first voltage of the signal applied to the data line to the second voltage of the signal applied to the data line.

22. The method of claim 21, wherein the string of memory cells comprises a first string of memory cells on a first substantially vertical pillar, and wherein the data line is further coupled to a second string of memory cells on a second substantially vertical pillar and comprising a target memory cell, targeted for programming, further coupled to the selected access line.

23. The method of claim 21, further comprising keeping a voltage of a signal applied to the first select gate substantially constant or decreasing the voltage of the signal applied to the first select gate from a first voltage of the signal applied to the first select gate to a second voltage of the signal applied to the first select gate while increasing the voltage of the signal applied to the source from the first voltage of the signal applied to the source to the second voltage of the signal applied to the source.

24. The method of claim 21, further comprising keeping a voltage of a signal applied to the second select gate substantially constant or decreasing the voltage of the signal applied to the second select gate from a first voltage of the signal applied to the second select gate to a second voltage of the signal applied to the second select gate while increasing the voltage of the signal applied to the data line from the first voltage of the signal applied to the data line to the second voltage of the signal applied to the data line.

25. The method of claim 21, further comprising increasing voltages of signals applied to unselected selected access lines coupled to other memory cells in the string of memory cells after or substantially concurrently with increasing the voltage of the signal applied to the source from the first voltage of the signal applied to the source to the second voltage of the signal applied to the source and after or substantially concurrently with increasing the voltage of the signal applied to the data line from the first voltage of the signal applied to the data line to the second voltage of the signal applied to the data line.

26. The method of claim 21, further comprising while maintaining the voltage of the signal applied to the source at the first voltage of the signal applied to the source before increasing the voltage of the signal applied to the source from the first voltage of the signal applied to the source to the second voltage of the signal applied to the source, increasing the voltage of the signal applied to the data line to the first voltage of the signal applied to the data line before increasing the voltage of the signal applied to a data line from the first voltage of the signal applied to the data line to the second voltage of the signal applied to the data line.

27. The method of claim 21, wherein increasing the voltage of the signal applied to the data line from the first voltage of the signal applied to the data line to the second voltage of the signal applied to the data line and increasing the voltage of the signal applied to the source from the first voltage of the signal applied to the source to the second voltage of the signal applied to the source occur substantially concurrently.

* * * * *